United States Patent
Sugihara

(10) Patent No.: US 12,333,781 B2
(45) Date of Patent: Jun. 17, 2025

(54) METHOD FOR SEARCHING FOR HOLE PATTERN IN IMAGE, PATTERN INSPECTION METHOD, PATTERN INSPECTION APPARATUS, AND APPARATUS FOR SEARCHING HOLE PATTERN IN IMAGE

(71) Applicant: NuFlare Technology, Inc., Yokohama (JP)

(72) Inventor: Shinji Sugihara, Ota-ku (JP)

(73) Assignee: NuFlare Technology, Inc., Yokohama (JP)

( * ) Notice: Subject to any disclaimer, the term of this patent is extended or adjusted under 35 U.S.C. 154(b) by 343 days.

(21) Appl. No.: 17/817,517

(22) Filed: Aug. 4, 2022

(65) Prior Publication Data

US 2022/0375195 A1 Nov. 24, 2022

Related U.S. Application Data

(63) Continuation of application No. PCT/JP2021/003882, filed on Feb. 3, 2021.

(30) Foreign Application Priority Data

Mar. 10, 2020 (JP) .................. 2020-041385

(51) Int. Cl.
*G06V 10/75* (2022.01)
*G06T 7/00* (2017.01)

(52) U.S. Cl.
CPC .......... *G06V 10/751* (2022.01); *G06T 7/0004* (2013.01)

(58) Field of Classification Search
CPC ...... G01N 23/2251; G06T 2207/10061; G06T 2207/30148; G06T 7/0004; G06T 7/0006;
(Continued)

(56) References Cited

U.S. PATENT DOCUMENTS

2013/0070078 A1* 3/2013 Takagi ................. G06T 7/001
348/80
2016/0169819 A1 6/2016 Usui
(Continued)

FOREIGN PATENT DOCUMENTS

JP 2004185019 A * 7/2004
JP 2011191296 A * 9/2011 ............. G03F 7/705
(Continued)

OTHER PUBLICATIONS

International Search Report issued May 11, 2021 in PCT/JP2021/003882, filed on Feb. 3, 2021, 2 pages.
(Continued)

*Primary Examiner* — Andrae S Allison
*Assistant Examiner* — Emmanuel Silva-Avina
(74) *Attorney, Agent, or Firm* — Oblon, McClelland, Maier & Neustadt, L.L.P.

(57) ABSTRACT

Method for searching a hole pattern in image includes extracting, from an image where a hole pattern is formed, plural outline position candidates serving as candidates for plural positions where an outline of the hole pattern passes, generating, for each pixel in a region including the plural outline position candidates, a distance map which defines, for each of plural directions, a distance from each of the plural outline position candidates to each of pixels arrayed in a target direction of the plural directions, extracting a candidate for a center pixel of the hole pattern by using the distance map generated for each direction, and searching, in the plural outline position candidates, a group of outline position candidates which satisfies a predetermined condition in the case of using the candidate for the center pixel as a starting point, as plural outline positions where the outline of the hole pattern passes.

14 Claims, 17 Drawing Sheets

(58) Field of Classification Search
CPC ........... G06T 7/74; G06T 7/001; G06V 10/44; G06V 10/751; H01L 22/00
USPC ........................................................ 382/181
See application file for complete search history.

(56) References Cited

U.S. PATENT DOCUMENTS

| | | |
|---|---|---|
| 2016/0313266 A1* | 10/2016 | Sugiyama .......... G01N 23/2206 |
| 2017/0372464 A1 | 12/2017 | Kitamura |
| 2018/0261424 A1 | 9/2018 | Tsuchiya |
| 2022/0013327 A1 | 1/2022 | Sugihara |

FOREIGN PATENT DOCUMENTS

| | | |
|---|---|---|
| JP | 2016-115851 A | 6/2016 |
| JP | 2018-4632 A | 1/2018 |
| JP | 2018-151202 A | 9/2018 |
| JP | 2022-16779 A | 1/2022 |

OTHER PUBLICATIONS

Office Action issued Oct. 3, 2023, in corresponding Japanese Patent Application No. 2020-041385 (with English Translation), 4 pages.

* cited by examiner

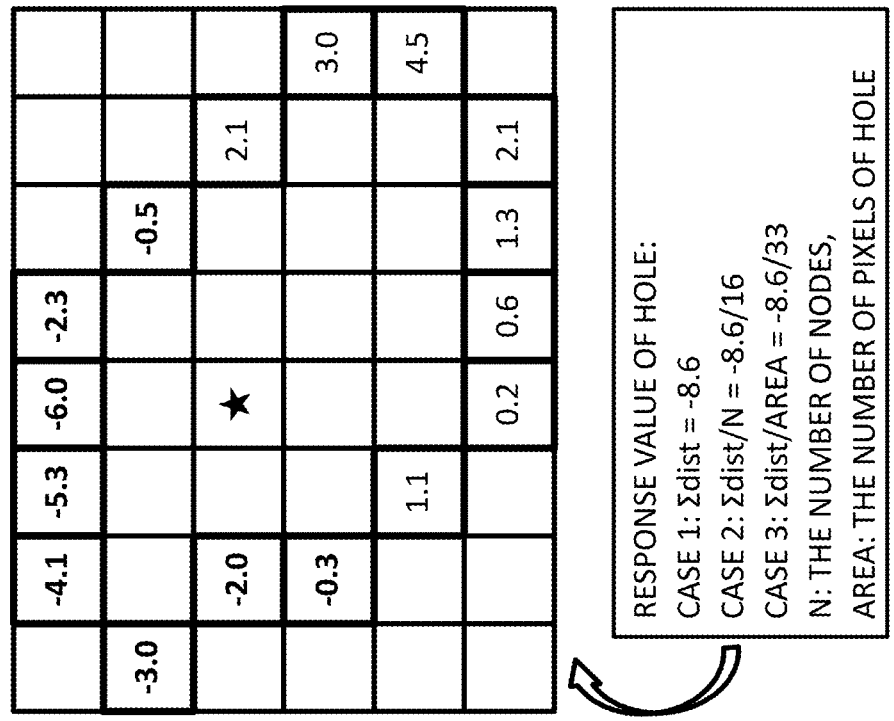
FIG.17A
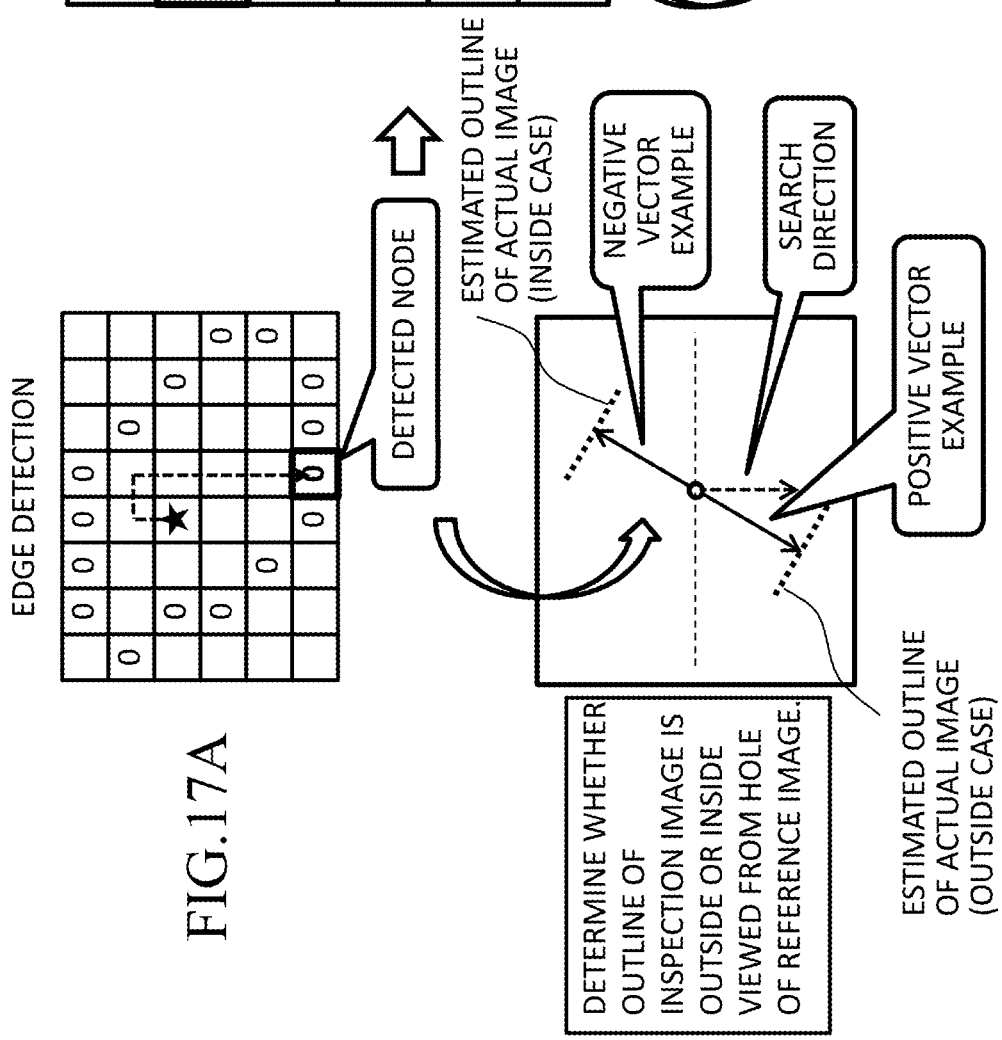
FIG.17B
FIG.17C

METHOD FOR SEARCHING FOR HOLE PATTERN IN IMAGE, PATTERN INSPECTION METHOD, PATTERN INSPECTION APPARATUS, AND APPARATUS FOR SEARCHING HOLE PATTERN IN IMAGE

CROSS-REFERENCE TO RELATED APPLICATION

This application is a continuation application based upon and claims the benefit of priority from prior Japanese Patent Application No. 2020-041385 (application number) filed on Mar. 10, 2020 in Japan, and International Application PCT/JP2021/003882, the International Filing Date of which is Feb. 3, 2021. The contents described in JP2020-041385 and PCT/JP2021/003882 are incorporated in the present application by reference.

BACKGROUND OF THE INVENTION

Field of the Invention

Embodiments of the present invention relate to a search method for a hole pattern in an image, a pattern inspection method, a pattern inspection apparatus, and a search apparatus for a hole pattern in an image. For example, embodiments of the present invention relate to an inspection apparatus that performs inspection using a secondary electron image of a pattern emitted from the substrate irradiated with multiple electron beams, an inspection apparatus that performs inspection using an optical image of a pattern acquired from the substrate irradiated with ultraviolet rays, or an inspection method therefor.

DESCRIPTION OF RELATED ART

With recent progress in high integration and large capacity of the LSI (Large Scale Integrated circuits), the line width (critical dimension) required for circuits of semiconductor elements is becoming increasingly narrower. Since LSI manufacturing requires an enormous production cost, it is essential to improve the yield. Meanwhile, as the scale of patterns that make up the LSI has reached the order of 10 nanometers or less, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on a mask for exposing/transferring an ultrafine pattern onto the semiconductor wafer by the photolithography technology. Therefore, the pattern inspection apparatus for inspecting defects on an exposure transfer mask used in manufacturing LSI also needs to be highly accurate.

As a defect inspection method, there is known a method of comparing a measured image acquired by imaging a pattern formed on a substrate, such as a semiconductor wafer or a lithography mask, with design data or with another measured image acquired by imaging an identical pattern on the substrate. For example, as a pattern inspection method, there is "die-to-die inspection" or "die-to-database inspection". The "die-to-die inspection" method compares data of measured images acquired by imaging the identical patterns at different positions on the same substrate. The "die-to-database inspection" method generates, based on design data of a pattern, design image data (reference image), and compares it with a measured image being measured data acquired by imaging the pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

Specifically, with respect to the pattern inspection apparatus described above, in addition to the type of apparatus that irradiates an inspection substrate with laser beams to obtain a transmission image or a reflection image of a pattern formed on the substrate, another type of inspection apparatus has been developed that acquires a pattern image by scanning the inspection substrate with primary electron beams and detecting secondary electrons emitted from the inspection substrate by the irradiation with the primary electron beams. Regarding such pattern inspection apparatuses, in order to highly accurately detect the position of a pattern edge (end portion), it has been examined, instead of comparing pixel values, to extract (obtain) the outline of a pattern in an image, and use the distance between the obtained outline and the outline of a reference image, as a determining index (e.g., refer to Japanese Patent Application Laid-open (JP-A) No. 2018-151202). However, it takes time to highly accurately extract a hole pattern from an image. Thus, it is required to perform a hole detection with high accuracy while aiming at reducing the processing time.

BRIEF SUMMARY OF THE INVENTION

According to one aspect of the present invention, a method for searching a hole pattern in an image includes extracting, from an image where a hole pattern is formed, a plurality of outline position candidates serving as candidates for a plurality of positions where an outline of the hole pattern passes; generating, with respect to each pixel in a region including the plurality of outline position candidates, for each direction of a plurality of directions, a distance map which defines a distance from each of the plurality of outline position candidates to each of pixels arrayed in a target direction of the plurality of directions; extracting a candidate for a center pixel of the hole pattern by using the distance map generated for the each direction; and searching, in the plurality of outline position candidates, a group of outline position candidates which satisfies a predetermined condition in a case of using the candidate for the center pixel as a starting point, as a plurality of outline positions where the outline of the hole pattern passes.

According to another aspect of the present invention, a pattern inspection method includes acquiring an inspection image of a substrate on which a first hole pattern has been formed, the inspection image being an image to be inspected; extracting, from the inspection image, a plurality of first outline position candidates serving as candidates for a plurality of positions where an outline of the first hole pattern passes; extracting, from a reference image to be compared with the inspection image, a plurality of second outline position candidates serving as candidates for a plurality of positions where an outline of a second hole pattern corresponding to the first hole pattern passes; generating, with respect to each pixel in a region including the plurality of second outline position candidates, for each direction of a plurality of directions, a distance map which defines a distance from each of the plurality of second outline position candidates to each of pixels arrayed in a target direction; extracting, using the distance map generated for the each direction, a candidate for a center pixel of the second hole pattern; searching, in the plurality of second outline position candidates, a group of second outline position candidates which satisfies a predetermined condition in a case of using the candidate for the center pixel as a starting point, as a plurality of reference outline positions where the outline of the second hole pattern passes; forming an inspection outline of the first hole pattern by interpolating a group of first outline position candidates close to the plurality of reference outline positions in the plurality of first outline position candidates; calculating a distance from each of the plurality of reference outline positions to the inspection outline; and comparing a value based on the distance and an inspection threshold, and outputting a result.

According to yet another aspect of the present invention, a pattern inspection apparatus includes an image acquisition mechanism configured to acquire an inspection image of a substrate on which a first hole pattern has been formed, the inspection image being an image to be inspected; a first outline position candidate extraction circuit configured to extract, from the inspection image, a plurality of first outline position candidates serving as candidates for a plurality of positions where an outline of the first hole pattern passes; a second outline position candidate extraction circuit configured to extract, from a reference image to be compared with the inspection image, a plurality of second outline position candidates serving as candidates for a plurality of positions where an outline of a second hole pattern corresponding to the first hole pattern passes; a distance map generation circuit configured to generate, with respect to each pixel in a region including the plurality of second outline position candidates, for each direction of a plurality of directions, a distance map which defines a distance from each of the plurality of second outline position candidates to each of pixels arrayed in a target direction; a center pixel candidate extraction circuit configured to extract, using the distance map generated for the each direction, a candidate for a center pixel of the second hole pattern; a search/detection circuit configured to search and/or detect, in the plurality of second outline position candidates, a group of second outline position candidates which satisfies a predetermined condition in a case of using the candidate for the center pixel as a starting point, as a plurality of reference outline positions where the outline of the second hole pattern passes; an inspection outline forming circuit configured to form an inspection outline of the first hole pattern by interpolating a group of first outline position candidates close to the plurality of reference outline positions in the plurality of first outline position candidates; a distance calculation circuit configured to calculate a distance from each of the plurality of reference outline positions to the inspection outline; and a comparison circuit configured to compare a value based on the distance and an inspection threshold.

According to yet another aspect of the present invention, an apparatus for searching a hole pattern in an image includes an outline position candidate extraction circuit configured to extract, from an image where a hole pattern is formed, a plurality of outline position candidates serving as candidates for a plurality of positions where an outline of the hole pattern passes; a distance map generation circuit configured to generate, with respect to each pixel in a region including the plurality of outline position candidates, for each direction of a plurality of directions, a distance map which defines a distance from each of the plurality of outline position candidates to each of pixels arrayed in a target direction of the plurality of directions; a center pixel candidate extraction circuit configured to extract, using the distance map generated for the each direction, a candidate for a center pixel of the hole pattern; and a search/detection circuit configured to search and/or detect, in the plurality of outline position candidates, a group of outline position candidates which satisfies a predetermined condition in a case of using the candidate for the center pixel as a starting point, as a plurality of outline positions where the outline of the hole pattern passes.

BRIEF DESCRIPTION OF THE DRAWINGS

FIGS. 17A to 17C are diagrams showing examples of a distance from a reference hole edge node to an inspection outline according to the first embodiment.

DETAILED DESCRIPTION OF THE INVENTION

In the following, embodiments of the present invention provide an apparatus and method that can perform a hole detection with high accuracy while aiming at reducing the processing time.

Further, embodiments below describe an electron beam inspection apparatus as an example of a pattern inspection apparatus and/or an image hole pattern search apparatus for searching a hole pattern in an image, but it is not limited thereto. For example, the inspection apparatus may be the one in which an inspection substrate, to be inspected, is irradiated with ultraviolet rays to obtain an inspection image using a light transmitted through the inspection substrate or reflected therefrom. Further, the embodiments below describe an inspection apparatus using multiple electron beams to acquire an image, but it is not limited thereto. The inspection apparatus using a single electron beam to acquire an image may also be employed.

First Embodiment

Figure 1:
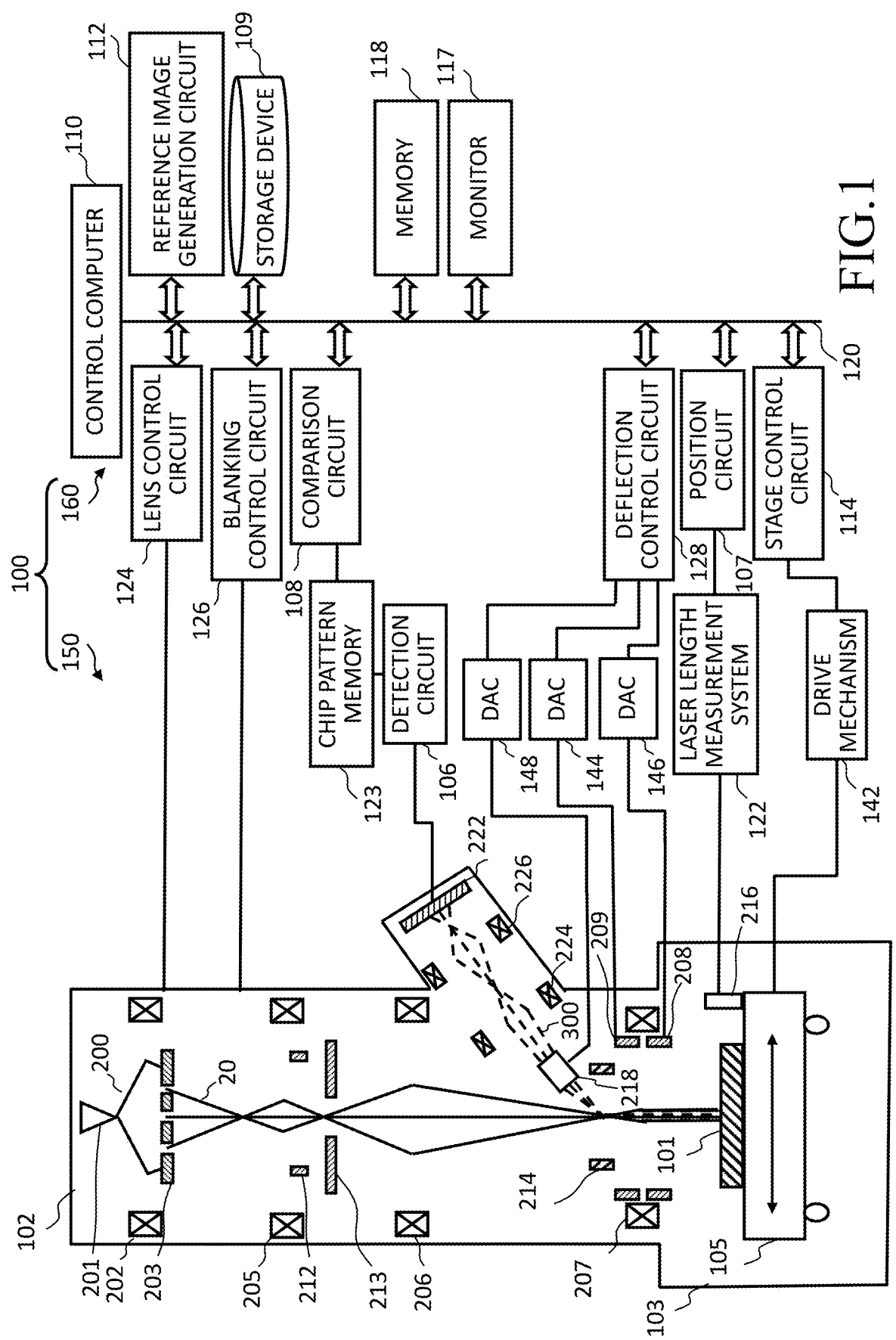
FIG. 1 is a diagram showing an example of a configuration of a pattern inspection apparatus according to a first embodiment.

FIG. 1 is a diagram showing an example of a configuration of a pattern inspection apparatus according to a first embodiment. In FIG. 1, an inspection apparatus 100 for inspecting a pattern formed on the substrate is an example of a multi-electron beam inspection apparatus. The inspection apparatus 100 includes an image acquisition mechanism 150 (secondary electron image acquisition mechanism) and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a bundle blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, an electromagnetic lens 226, and a multi-detector 222. In the case of FIG. 1, a primary electron optical system which irradiates a substrate 101 with multiple primary electron beams is composed of the electron gun 201, the electromagnetic lens 202, the shaping aperture array substrate 203, the electromagnetic lens 205, the bundle blanking deflector 212, the limiting aperture substrate 213, the electromagnetic lens 206, the electromagnetic lens 207 (objective lens), the main deflector 208, and the sub deflector 209. A secondary electron optical system which irradiates the multi-detector 222 with multiple secondary electron beams is composed of the beam separator 214, the deflector 218, the electromagnetic lens 224, and the electromagnetic lens 226.

In the inspection chamber 103, there is disposed a stage 105 movable at least in the x and y directions. The substrate 101 (target object) to be inspected is mounted on the stage 105. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. When the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is mainly described below. The substrate 101 is placed, with its pattern-forming surface facing upward, on the stage 105, for example. Moreover, on the stage 105, there is disposed a mirror 216 which reflects a laser beam for measuring a laser length emitted from a laser length measuring system 122 arranged outside the inspection chamber 103. The multi-detector 222 is connected, at the outside of the electron beam column 102, to a detection circuit 106.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a storage device 109 such as a magnetic disk drive, a monitor 117, and a memory 118. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The detection circuit 106 is connected to a chip pattern memory 123 which is connected to the comparison circuit 108. The stage 105 is driven by a drive mechanism 142 under the control of the stage control circuit 114. In the drive mechanism 142, a drive system such as a three (x-, y-, and θ-) axis motor which provides drive in the directions of x, y, and θ in the stage coordinate system is configured, and therefore, the stage 105 can be moved in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. In the stage coordinate system, the x, y, and θ directions are set, for example, with respect to a plane perpendicular to the optical axis (center axis of electron trajectory) of the multiple primary electron beams.

The electromagnetic lenses 202, 205, 206, 207 (objective lens), 224 and 226, and the beam separator 214 are controlled by the lens control circuit 124. The bundle blanking deflector 212 is composed of two or more electrodes (or poles), and each electrode is controlled by the blanking control circuit 126 through a DAC amplifier (not shown). The sub deflector 209 is composed of four or more electrodes (or poles), and each electrode is controlled by the deflection control circuit 128 through the DAC amplifier 144. The main deflector 208 is composed of four or more electrodes (or poles), and each electrode is controlled by the deflection control circuit 128 through the DAC amplifier 146. The deflector 218 is composed of four or more electrodes (or poles), and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
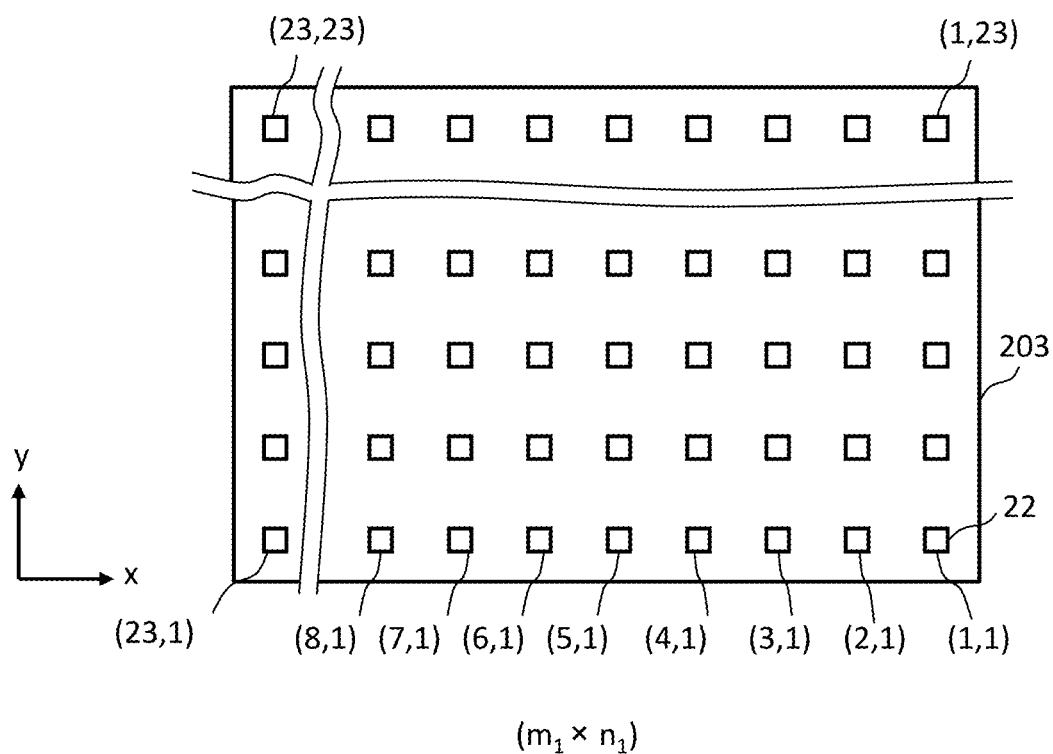
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (width in the x direction) (each column in the y direction) and $n_1$ rows long (length in the y direction) (each row in the x direction) are two-dimensionally formed at a predetermined arrangement pitch in the shaping aperture array substrate 203, where one of $m_1$ and $n_1$ is an integer of 2 or more, and the other is an integer of 1 or more. In the case of FIG. 2, 23×23 holes (openings) 22 are formed. Ideally, each of the holes 22 is a rectangle (including a square) having the same dimension, shape, and size. Alternatively, ideally, each of the holes 22 may be a circle with the same outer diameter. $m_1 \times n_1 (=N)$ multiple primary electron beams 20 are formed by letting portions of the electron beam 200 individually pass through a corresponding one of a plurality of holes 22.

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all the plurality of holes 22 is irradiated by the electron beam 200. The multiple primary electron beams 20 are formed by letting portions of the electron beam 200 applied to the positions of the plurality of holes 22 individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens), while repeating forming an intermediate image and a crossover, passing through the beam separator 214 disposed at the crossover position of each beam (at the intermediate image position of each beam) of the multiple primary electron beams 20. Then, the electromagnetic lens 207 focuses the multiple primary electron beams 20 onto the substrate 101. The multiple primary electron beams 20 having been focused on the substrate 101 (target object) by the electromagnetic lens 207 (objective lens) are collectively deflected by the main deflector 208 and the sub deflector 209 to irradiate respective beam irradiation positions on the substrate 101. When all of the multiple primary electron beams 20 are collectively deflected by the bundle blanking deflector 212, they deviate from the hole in the center of the limiting aperture substrate 213 and are blocked by the limiting aperture substrate 213. On the other hand, the multiple primary electron beams 20 which were not deflected by the bundle blanking deflector 212 pass through the hole in the center of the limiting aperture substrate 213 as shown in FIG. 1. Blanking control is provided by On/Off of the bundle blanking deflector 212, and thus On/Off of the multiple beams is collectively controlled. In this way, the limiting aperture substrate 213 blocks the multiple primary electron beams 20 which were deflected to be in the "Off condition" by the bundle blanking deflector 212. Then, the multiple primary electron beams 20 for inspection (for image acquisition) are formed by the beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons, each corresponding to each of the multiple primary electron beams 20, is emitted from the substrate 101 due to the irradiation with the multiple primary electron beams 20.

The multiple secondary electron beams 300 emitted from the substrate 101 travel to the beam separator 214 through the electromagnetic lens 207.

Here, the beam separator 214 generates an electric field and a magnetic field to be orthogonal to each other in a plane perpendicular to the traveling direction of the center beam (that is, the electron trajectory center axis) of the multiple primary electron beams 20. The electric field exerts a force in a fixed direction regardless of the traveling direction of electrons. In contrast, the magnetic field exerts a force according to Fleming's left-hand rule. Therefore, the direction of force acting on (applied to) electrons can be changed depending on the entering (or "traveling") direction of electrons. With respect to the multiple primary electron beams 20 entering the beam separator 214 from above, since the forces due to the electric field and the magnetic field cancel each other out, the beams 20 travel straight downward. On the other hand, with respect to the multiple secondary electron beams 300 entering the beam separator 214 from below, since both the forces due to the electric field and the magnetic field are exerted in the same direction, the beams 300 are bent obliquely upward, and separated from the multiple primary electron beams 20.

The multiple secondary electron beams 300 having been bent obliquely upward and separated from the multiple primary electron beams 20 are further bent by the deflector 218, and projected onto the multi-detector 222 while being refracted by the electromagnetic lenses 224 and 226. The multi-detector 222 detects the projected multiple secondary electron beams 300. Reflected electrons and secondary electrons may be projected on the multi-detector 222, or it is also acceptable that reflected electrons are emitted along the way and remaining secondary electrons are projected. The multi-detector 222 includes a two-dimensional sensor. Then, each secondary electron of the multiple secondary electron beams 300 collides with a corresponding region of the two-dimensional sensor, thereby generating electrons, and secondary electron image data is generated for each pixel. In other words, in the multi-detector 222, a detection sensor is disposed for each primary electron beam of the multiple primary electron beams 20. Then, the detection sensor detects a corresponding secondary electron beam emitted by irradiation with each primary electron beam. Therefore, each of a plurality of detection sensors in the multi-detector 222 detects an intensity signal of a secondary electron beam for an image resulting from irradiation with an associated corresponding primary electron beam. The intensity signal detected by the multi-detector 222 is output to the detection circuit 106.

Figure 3:
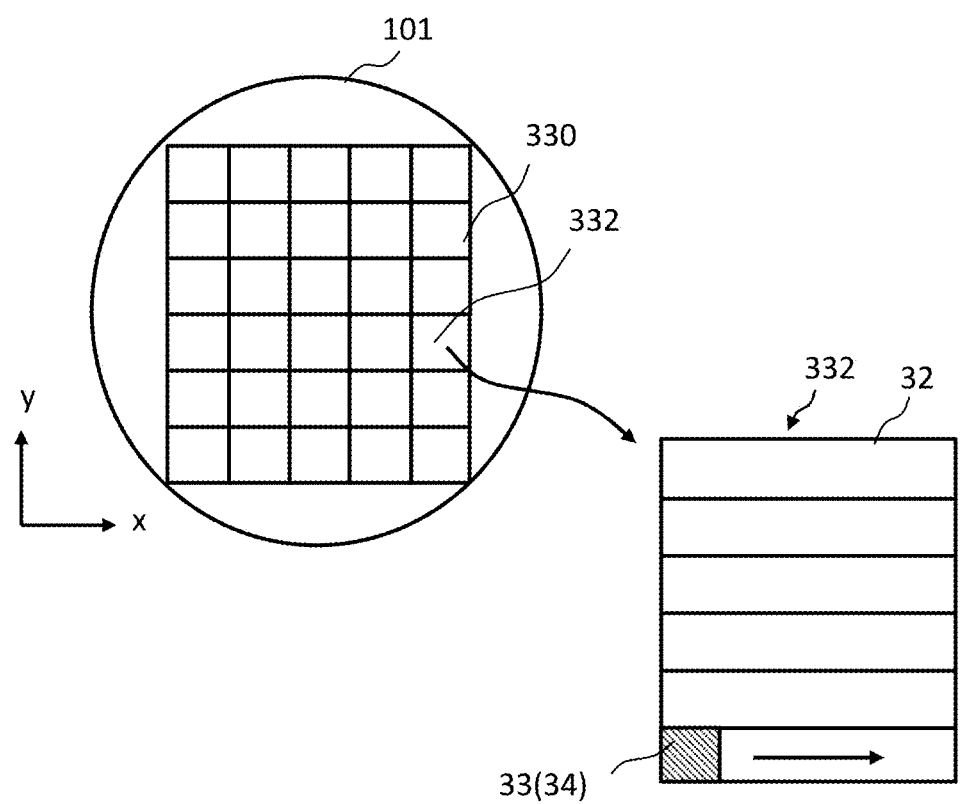
FIG. 3 is an illustration showing an example of a plurality of chip regions formed on a semiconductor substrate, according to the first embodiment.

FIG. 3 is an illustration showing an example of a plurality of chip regions formed on a semiconductor substrate, according to the first embodiment. In FIG. 3, in the case of the substrate 101 being a semiconductor substrate (wafer), a plurality of chips (wafer dies) 332 are formed in a two-dimensional array in an inspection region 330 of the semiconductor substrate (wafer). With respect to each chip 332, a mask pattern for one chip formed on an exposure mask substrate is reduced to, for example, ¼, and exposed/transferred onto each chip 332 by an exposure device, such as a stepper and a scanner, (not shown). For example, the region of each chip 332 is divided in the y direction into a plurality of stripe regions 32 by a predetermined width. The scanning operation by the image acquisition mechanism 150 is carried out for each stripe region 32, for example. The operation of scanning the stripe region 32 advances relatively in the x direction while the stage 105 is moved in the −x direction, for example. Each stripe region 32 is divided in the longitudinal direction into a plurality of rectangular (including square) regions 33. Beam application to a target rectangular region 33 is achieved by collectively deflecting all the multiple primary electron beams 20 by the main deflector 208.

Figure 4:
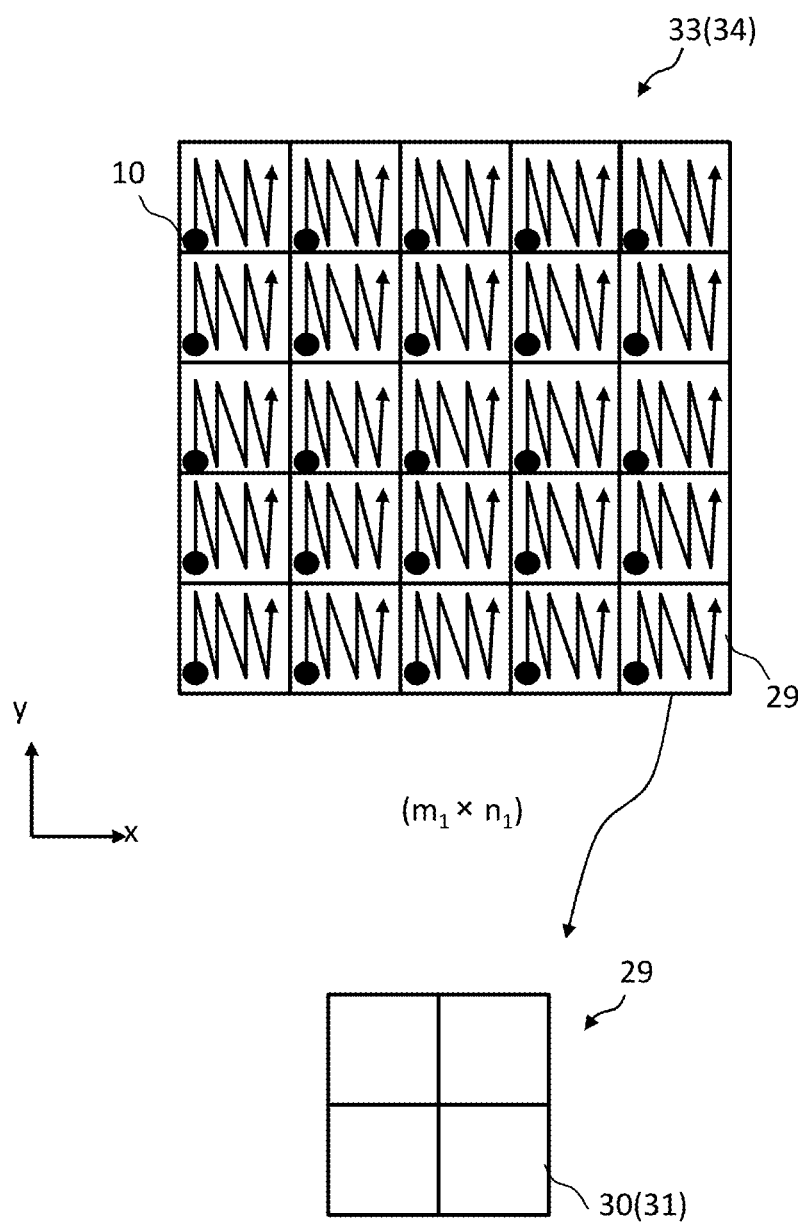
FIG. 4 is an illustration showing a scanning operation with multiple beams according to the first embodiment.

FIG. 4 is an illustration showing a scanning operation with multiple beams according to the first embodiment. FIG. 4 shows the case of multiple primary electron beams 20 of 5 rows×5 columns. The size of an irradiation region 34 which can be irradiated by one irradiation with the multiple primary electron beams 20 is defined by (x direction size obtained by multiplying a beam pitch in the x direction of the multiple primary electron beams 20 on the substrate 101 by the number of beams in the x direction)×(y direction size obtained by multiplying a beam pitch in the y direction of the multiple primary electron beams 20 on the substrate 101 by the number of beams in the y direction). Preferably, the width of each stripe region 32 is set to be the same as the size in the y direction of the irradiation region 34, or to be the size reduced by the width of the scanning margin. In the case of FIGS. 3 and 4, the irradiation region 34 and the rectangular region 33 are of the same size. However, it is not limited thereto. The irradiation region 34 may be smaller than the rectangular region 33, or larger than it. The inside of a sub-irradiation region 29 is irradiated and scanned with each beam of the multiple primary electron beams 20, where the sub-irradiation region 29 is surrounded by the beam pitch in the x direction and the beam pitch in the y direction and the beam concerned itself is located therein. Each primary electron beam 10 of the multiple primary electron beams 20 is associated with any one of the sub-irradiation regions 29 which are different from each other. At the time of each shot, each primary electron beam 10 is applied to the same position in the associated sub-irradiation region 29. The primary electron beam 10 is moved in the sub-irradiation region 29 by collective deflection of all the multiple primary electron beams 20 by the sub deflector 209. By repeating this operation, the inside of one sub-irradiation region 29 is irradiated with one primary electron beam 10 in order. Then, when scanning of one sub-irradiation region 29 is completed, the irradiation position is moved to an adjacent rectangular region 33 in the same stripe region 32 by collectively deflecting all of the multiple primary electron beams 20 by the main deflector 208. By repeating this operation, the inside of the stripe region 32 is irradiated in order. After completing scanning of one stripe region 32, the irradiation position is moved to the next stripe region 32 by moving the stage 105 and/or by collectively deflecting all of the multiple primary electron beams 20 by the main deflector 208. As described above, a secondary electron image of each sub-irradiation region 29 is acquired by irradiation with each primary electron beam 10. By combining secondary electron images of respective sub-irradiation regions 29, a secondary electron image of the rectangular region 33, a secondary electron image of the stripe region 32, or a secondary electron image of the chip 332 is configured.

As shown in FIG. 4, each sub-irradiation region 29 is divided into a plurality of rectangular frame regions 30, and a secondary electron image (inspection image, image to be inspected) in units of frame regions 30 is used for inspection. In the example of FIG. 4, one sub-irradiation region 29 is divided into four frame regions 30, for example. However, the number used for the dividing is not limited to four, and other number may be used.

It is also preferable to group, for example, a plurality of chips 332 aligned in the x direction in the same group, and to divide each group into a plurality of stripe regions 32 by a predetermined width in the y direction, for example. Then, moving between stripe regions 32 is not limited to the moving in each chip 332, and it is also preferable to move in each group.

When the multiple primary electron beams 20 irradiate the substrate 101 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20. Similarly, when the inside of the sub-irradiation region 29 is scanned, the emission position of each secondary electron beam changes every second in the sub-irradiation region 29. Thus, the deflector 218 collectively deflects the multiple secondary electron beams 300 so that each secondary electron beam whose emission position has changed as described above may be applied to a corresponding detection region of the multi-detector 222.

With respect to inspecting a detected inspection image, a hole pattern CD (size) error is one of pattern defects that should be detected. As described above, it takes time to highly accurately extract a hole pattern from an image. For example, the throughput of performing an omnidirectional inspection which starts in a state where it is unknown to be a closed figure or not, and of following the outline (contour) of a figure is a huge amount, and therefore, the inspection may take a long time. Further, in such a method, there is a possibility of accidentally following the outline of an adjacent figure. Therefore, the shape of a detected hole pattern is inaccurate, and thus, a problem may occur that the inspection accuracy deteriorates. Accordingly, it is required to perform a hole detection with high accuracy while aiming at reducing the processing time. Then, the first embodiment describes a configuration to extract a candidate for the center of a hole pattern, and to obtain an outline position of the hole pattern based on the candidate center.

Figure 5:
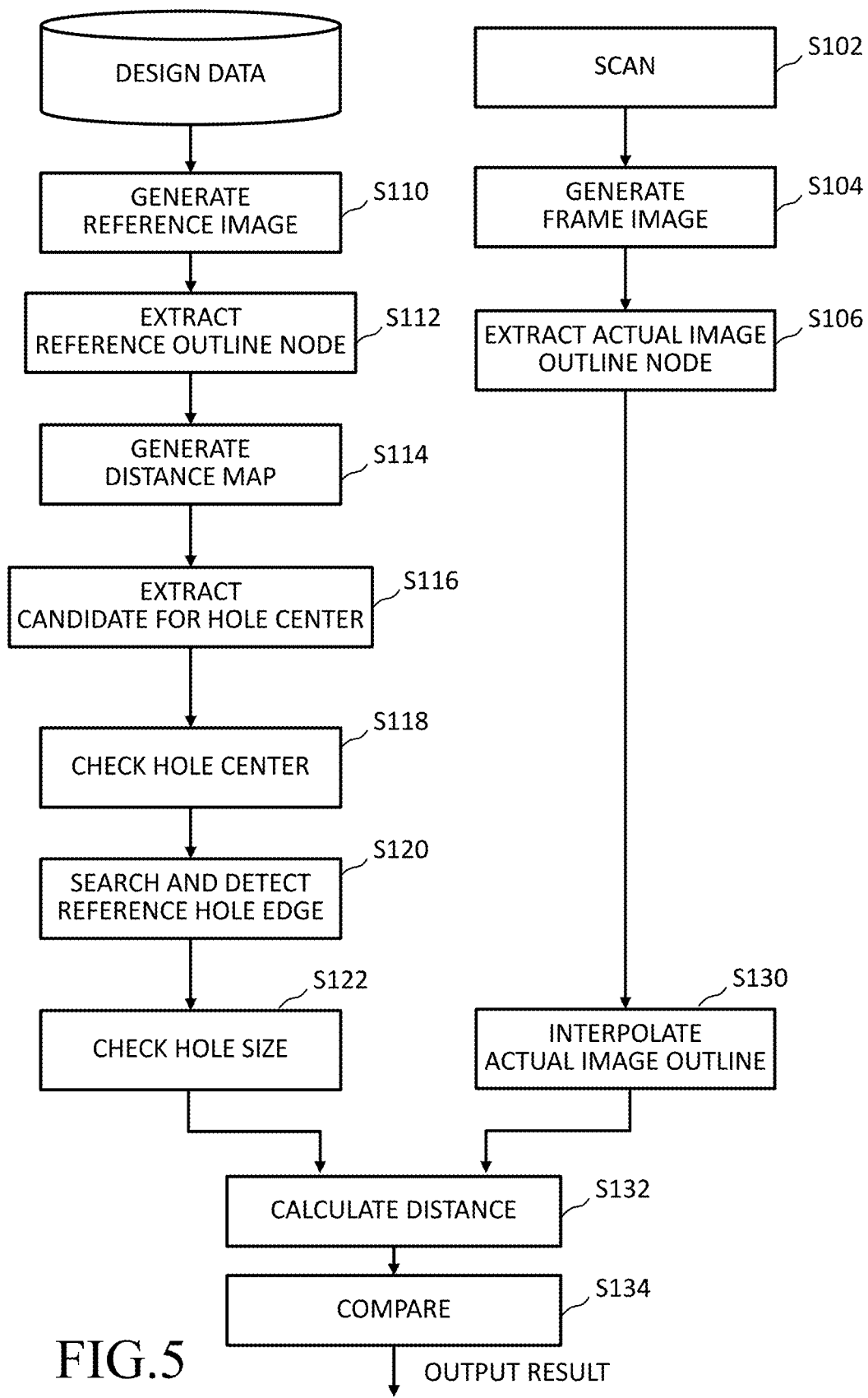
FIG. 5 is a flowchart showing an example of main steps of an inspection method according to the first embodiment.

FIG. 5 is a flowchart showing an example of main steps of an inspection method according to the first embodiment. In FIG. 5, the inspection method of the first embodiment executes a series of steps: a scanning step (S102), a frame image generation step (S104), an actual image outline node extraction step (S106) a reference image generation step (S110), a reference outline node extraction step (S112), a distance map generation step (S114), a hole center candidate extraction step (S116), a hole center check step (S118), a reference hole edge search/detection step (S120), a hole size check step (S122), an actual image outline interpolation step (S130), a distance calculation step (S132), and a comparison step (S134).

In the scanning step (S102), the image acquisition mechanism 150 acquires an inspection image of the substrate 101 on which a figure pattern including a hole pattern (first hole pattern) has been formed. Specifically, the image acquisition mechanism 150 irradiates the substrate 101, on which a hole pattern has been formed, with the multiple primary electron beams 20 to acquire a secondary electron image of the substrate 101 by detecting the multiple secondary electron beams 300 emitted from the substrate 101 due to the irradiation with the multiple primary electron beams 20. As described above, reflected electrons and secondary electrons may be projected on the multi-detector 222, or alternatively, after reflected electrons having been emitted along the way, only remaining secondary electrons (the multiple secondary electron beams 300) may be projected thereon.

As described above, the multiple secondary electron beams 300 emitted from the substrate 101 due to the irradiation with the multiple primary electron beams 20 are detected by the multi-detector 222. Detected data (measured image data: secondary electron image data: inspection image data) on the secondary electron of each pixel in each sub irradiation region 29 detected by the multi-detector 222 is output to the detection circuit 106 in order of measurement. In the detection circuit 106, the detected data in analog form is converted into digital data by an A-D converter (not shown), and stored in the chip pattern memory 123. Then, the acquired measured image data is transmitted to the comparison circuit 108, together with information on each position from the position circuit 107.

Figure 6:
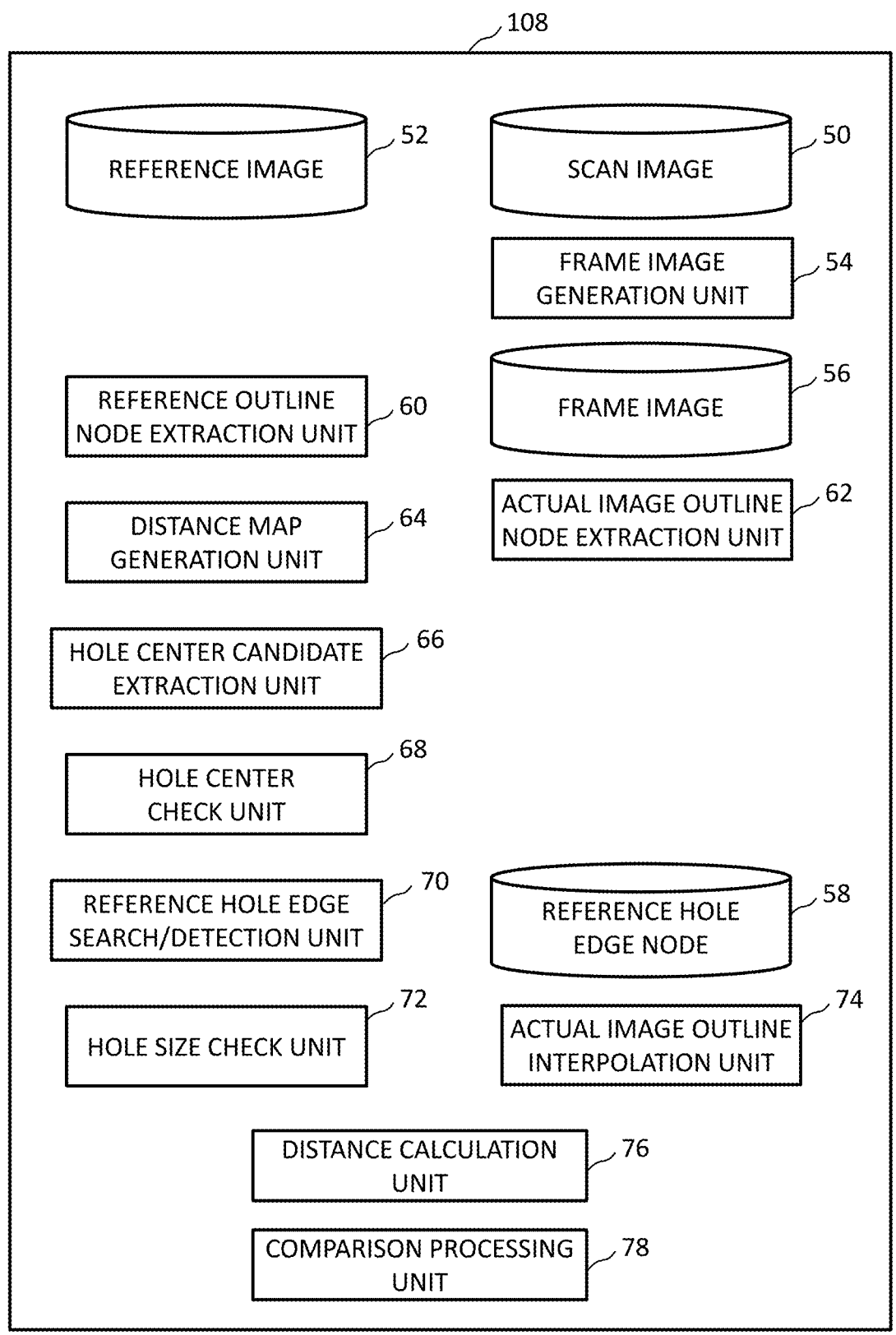
FIG. 6 is a block diagram showing an example of a configuration in a comparison circuit according to the first embodiment.

FIG. 6 is a block diagram showing an example of a configuration in a comparison circuit according to the first embodiment. In FIG. 6, in the comparison circuit 108, there are arranged storage devices 50, 52, 56, and 58 such as magnetic disk drives, a frame image generation unit 54, a reference outline node extraction unit 60, an actual image outline node extraction unit 62, a distance map generation unit 64, a hole center candidate extraction unit 66, a hole center check unit 68, a reference hole edge search/detection unit 70, a hole size check unit 72, an actual image outline interpolation unit 74, a distance calculation unit 76, and a comparison processing unit 78. Each of the "units" such as the frame image generation unit 54, the reference outline node extraction unit 60, the actual image outline node extraction unit 62, the distance map generation unit 64, the hole center candidate extraction unit 66, the hole center check unit 68, the reference hole edge search/detection unit 70, the hole size check unit 72, the actual image outline interpolation unit 74, the distance calculation unit 76, and the comparison processing unit 78 includes processing circuitry. As the processing circuitry, for example, an electric circuit, computer, processor, circuit board, quantum circuit, semiconductor device, or the like can be used. Further, common processing circuitry (the same processing circuitry), or different processing circuitry (separate processing circuitry) may be used for each of the "units". Input data required in the frame image generation unit 54, the reference outline node extraction unit 60, the actual image outline node extraction unit 62, the distance map generation unit 64, the hole center candidate extraction unit 66, the hole center check unit 68, the reference hole edge search/detection unit 70, the hole size check unit 72, the actual image outline interpolation unit 74, the distance calculation unit 76, and the comparison processing unit 78, and calculated results are stored in a memory (not shown) or in the memory 118 each time.

The measured image data (beam image) transmitted into the comparison circuit 108 is stored in the storage device 50.

In the frame image generation step (S104), the frame image generation unit 54 generates a frame image 31 of each of a plurality of frame regions 30 obtained by further dividing the image data of the sub-irradiation region 29 acquired by scanning with each primary electron beam 10. In order to prevent missing an image, it is preferable that margin regions overlap each other with respect to respective frame regions 30. The generated frame image 31 is stored in the storage device 56.

In the actual image outline node extraction step (S106), the actual image outline node extraction unit 62 (first outline position candidate extraction unit) extracts, from the frame image 31 (inspection image), a plurality of outline position candidates (first outline position candidate) serving as candidates for a plurality of positions where the outline of a hole pattern (first hole pattern) passes. Each outline position candidate of a hole pattern of an actual (real) image is here defined as an actual image outline node. Specifically, it operates as follows: The actual image outline node extraction unit 62 (differential intensity calculation unit) calculates, for each pixel of the frame image 31, a gradient (differential intensity) of a gray-scale value of a pixel concerned.

Figure 7:
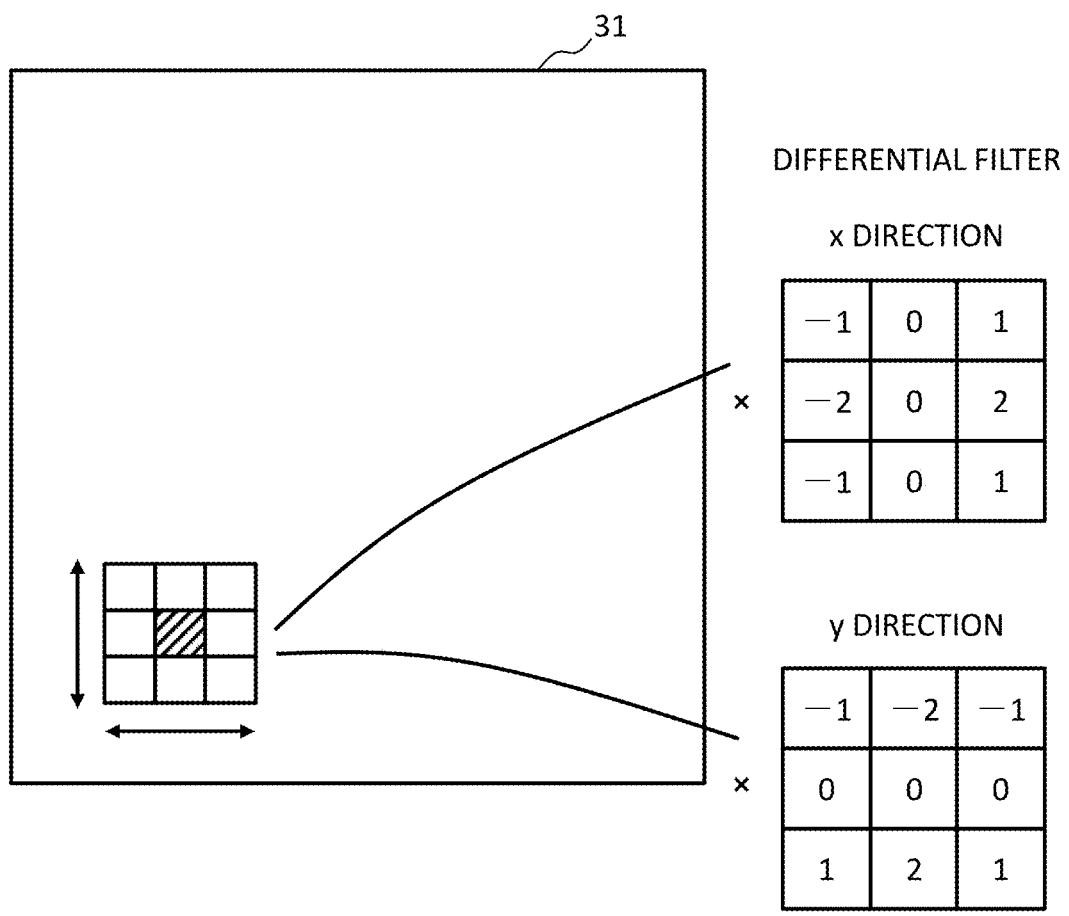
FIG. 7 is a diagram illustrating calculation of a gradient of a gray scale value of each pixel according to the first embodiment.

FIG. 7 is a diagram illustrating calculation of a gradient of a gray scale value of each pixel according to the first embodiment. In FIG. 7, the actual image outline node extraction unit 62 convolves a differential filter with a pixel array (e.g., 512×512) of each frame image 31. Specifically, while changing a pixel to be a target in order, the actual image outline node extraction unit 62 extracts, for example, a 3×3 pixel array which centers on the target pixel, and multiplies the pixel array by the differentiation filter. The pixel array centering on the target pixel is not limited to the pixel array of 3×3, and it may be composed of pixels more than 3×3. As shown in FIG. 7, the differentiation filter is configured by an x direction differentiation filter and a y direction differentiation filter. It is preferable to use, as the differentiation filter, a Sobel filter which can extract a pixel with a large gradient of the gray scale level by performing a differential approximation while reducing noise by levelling in the lateral direction (the x direction) or in the longitudinal direction (the y direction) after giving a weight to the center of the pixel array. In the case of FIG. 7, a differentiation filter of 3×3 is used as an example. However, it is not limited thereto, and it may be composed of pixels more than 3×3. Then, the x direction differential filter and the y direction differential filter are individually convolved with, for example, the pixel array of 3×3 centering on the target pixel. Thereby, the value of the gradient in the x direction and the value of the gradient in the y direction can be calculated. Then, the actual image outline node extraction unit 62 obtains the magnitude (value) of the gradient by calculating a square root of sum of squares of the gradient in the x direction and the gradient in the y direction.

The actual image outline node extraction unit 62 calculates the position of an outline for each sub pixel, with respect to each pixel whose gradient magnitude (differential intensity value) is greater than or equal to a threshold. For example, the actual image outline node extraction unit 62 extracts, for each pixel whose gradient magnitude (differential intensity value) is greater than or equal to a threshold, a one-dimensional profile of a plurality of pixels in the direction of the normal line to the gradient of the pixel concerned.

Figure 8A:
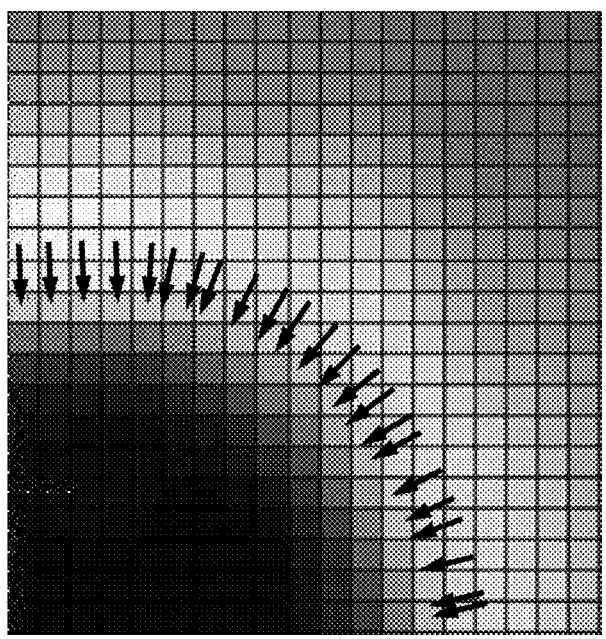
FIGS. 8A and 8B are illustrations showing an example of a figure pattern and a gradient vector according to the first embodiment.
Figure 8B:
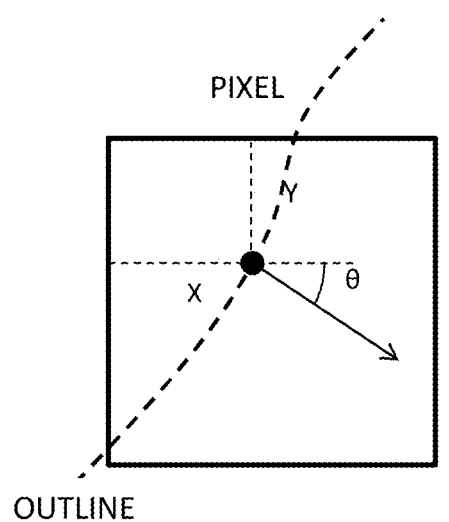

FIGS. 8A and 8B are illustrations showing an example of a figure pattern and a gradient vector according to the first embodiment. FIG. 8A shows an example of gradient vectors of a plurality of pixels each with a gradient value greater than or equal to a threshold value, at the upper right part of a hole pattern. For example, with respect to a pixel on the outline in the x direction of the figure, a gradient vector of a predetermined size in the y direction (or −y direction) can be obtained. Although not shown, for example, with respect to a pixel on the outline in the y direction of the figure, a gradient vector of a predetermined size in the x direction (or −x direction) can be obtained. For example, with respect to a pixel on the outline not in the x direction nor the y direction, such as at the corner of the figure, a gradient vector of a predetermined size in a combined direction of the x and y directions can be obtained. Here, the vector of the gradient vector indicates the direction of the normal line to the gradient of the pixel concerned. The normal line direction corresponds to the direction orthogonal to an iso-gradient value line (iso-differential intensity line). In an actual calculation, assuming that the gradient in the x direction is a gradient vector in the x direction and the gradient in the y direction is a gradient vector in the y direction, the direction obtained by combining (adding) the gradient vector in the x direction and the gradient vector in the y direction corresponds to the normal line direction. Although, in the example of FIG. 8A, the gradient vectors of a plurality of pixels each with a gradient value greater than or equal to a threshold value are extracted and shown, it goes without saying that gradient vectors may also individually exist for other pixels. For each frame image 31, the actual image outline node extraction unit 62 extracts pixels each with a gradient value greater than or equal to a threshold value in gradient vectors of pixels in the frame image 31 concerned. Then, for each extracted pixel, the actual image outline node extraction unit 62 extracts a one-dimensional profile in the direction of the normal line to the gradient of the pixel concerned. FIG. 8B shows an example of an outline passing through the inside of a pixel in a hole pattern.

Figure 9:
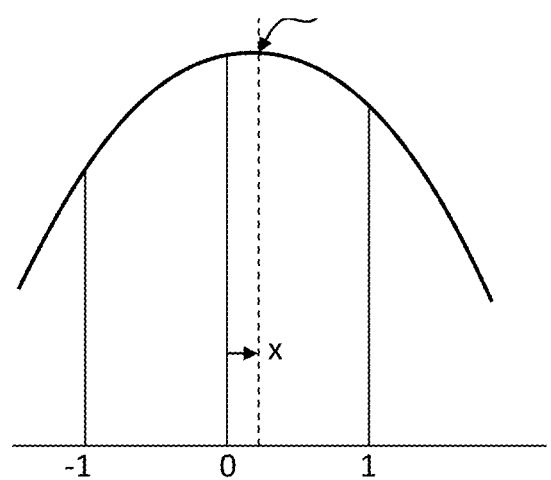
FIG. 9 is an illustration showing an example of a one-dimensional profile according to the first embodiment.

FIG. 9 is an illustration showing an example of a one-dimensional profile according to the first embodiment. The actual image outline node extraction unit 62 extracts, for each sub pixel, a peak position of a one-dimensional profile of pixels arranged in the normal line direction. The example of FIG. 9 shows that the peak position is located at the position shifted from the reference position (e.g., pixel center) by x, where $0 \leq x \leq 1$, in the pixel through which the outline passes. The peak position serves as an actual (real) image outline node. The peak position with respect to the y direction is similarly obtained.

By performing the same operation as described above for each pixel with a differential intensity value greater than or equal to a threshold, the actual image outline node extraction unit 62 extracts a plurality of outline nodes which serve as candidates for a plurality of positions where the outline of a hole pattern in the frame image 31 passes. The same operation is also performed for a reference image. First, a reference image is generated.

In the reference image generation step (S110), the reference image generation circuit 112 generates, for each frame region 30, a reference image corresponding to the frame image 31, based on design data serving as a basis of a figure pattern including a hole pattern formed on the substrate 101. Specifically, it operates as follows: First, design pattern data is read from the storage device 109 through the control computer 110, and each figure pattern defined by the read design pattern data is converted into image data of binary or multiple values.

As described above, basic figures defined by the design pattern data are, for example, rectangles (including squares) and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data used as the figure data is input to the reference image generation circuit 112, the data is developed into data for each figure. Then, with respect to each figure data, the figure code, the figure dimensions, and the like indicating the figure shape of each figure data are interpreted. The reference image generation circuit 112 develops each figure data to design pattern image data in binary or multiple values as a pattern to be arranged in squares in units of grids of predetermined quantization dimensions, and outputs the developed data. In other words, the reference image generation circuit 112 reads design data, calculates the occupancy of a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^8 (= 1/256)$, the occupancy rate in each pixel is calculated by allocating sub regions which correspond to the region of figures arranged in the pixel concerned and each of which corresponds to a $1/256$ resolution. Then, the 8-bit occupancy rate data is output to the reference image generation circuit 112. Such square regions (inspection pixels) can be commensurate with pixels of measured data.

Next, the reference image generation circuit 112 performs filtering processing on design image data of a design pattern which is image data of a figure, using a predetermined filter function. Thereby, it becomes possible to match/fit the design image data being design side image data, whose image intensity (gray scale level) is represented by digital values, with image generation characteristics obtained by irradiation with the multiple primary electron beams 20. Image data for each pixel of a generated reference image is output to the comparison circuit 108. The reference image data transmitted into the comparison circuit 108 is stored in the storage device 52.

In the reference outline node extraction step (S112), the reference outline node extraction unit 60 (second outline position candidate extraction unit) extracts, from a reference image to be compared with the frame image 31 (inspection image to be inspected), a plurality of outline position candidates (second outline position candidate) serving as candidates for a plurality of positions where the outline of a hole pattern (second hole pattern) passes. Each of outline position candidates serving as candidates for positions where the outline of a hole pattern of a reference image passes is here defined as a reference outline node. Specifically, it operates as follows: The reference outline node extraction unit 60 (differential intensity calculation unit) calculates, for each pixel of a reference image, the gradient (differential intensity) of the gray scale value of the pixel concerned. Similarly to the case of the frame image 31, the reference outline node extraction unit 60 individually convolves the x direction differential filter and the y direction differential filter with the pixel array of, for example, 3×3 centering on the target pixel. Thereby, the value of the gradient in the x direction and the value of the gradient in the y direction can be calculated. Then, the reference outline node extraction unit 60 obtains the magnitude (value) of the gradient by calculating a square root of sum of squares of the gradient in the x direction and the gradient in the y direction.

Similarly to the case of the frame image 31, the reference outline node extraction unit 60 calculates the position of an outline for each sub pixel, with respect to each pixel whose gradient magnitude (differential intensity value) is greater than or equal to a threshold.

Thereby, a plurality of actual image outline nodes (first outline position candidate) of a hole pattern of an actual image, and a plurality of reference outline nodes (second outline position candidate) of a hole pattern of a corresponding reference image can be obtained.

In the distance map generation step (S114), with respect to each pixel in a region including the plurality of reference outline nodes of the reference image, the distance map generation unit 64 generates a distance map which defines the distance from each of the plurality of reference outline nodes to each of pixels arranged in a target direction of a plurality of directions, for each direction in the plurality of directions.

Figures 10A, 10B, 10C, 10D:
FIGS. 10A to 10D are diagrams of examples of a distance map according to the first embodiment.

FIGS. 10A to 10D are diagrams of examples of a distance map according to the first embodiment. FIGS. 10A to 10D show four distance maps which individually define the distances from the four directions of top, bottom, right and left, for example. In each distance map, any one of a plurality of reference outline nodes is included in a pixel defined by zero. In each distance map of FIGS. 10A to 10D, sixteen pixels are individually defined by zero as a reference outline node, for example. FIG. 10A shows, for each pixel, the distance from left to right starting from each reference outline node pixel to each pixel concerned. FIG. 10B shows, for each pixel, the distance from right to left starting from each reference outline node pixel to each pixel concerned. FIG. 10C shows, for each pixel, the distance from top to bottom starting from each reference outline node pixel to each pixel concerned. FIG. 10D shows, for each pixel, the distance from bottom to top starting from each reference outline node pixel to each pixel concerned. In the pixel denoted by *, the distance from an unshown reference outline node pixel is stored.

In the example of FIG. 10A, it turns out that the pixel in the third row from the top and in the second column from the left is one of the reference outline nodes. In the pixel shifted rightward by one pixel from the reference outline node pixel, the distance 1 is defined. In the pixel shifted rightward by two pixels from the reference outline node pixel, the distance 2 is defined. In the case of FIG. 10A, such definition is similarly performed up to the distance 4, with respect to the reference outline node pixel in the third row from the top and in the second column from the left. When reaching another reference outline node pixel, the distance definition is ended. The distance from each of other reference outline node pixels is defined similarly.

In the example of FIG. 10B, it turns out that the pixel in the third row from the top and in the seventh column from the left is one of the reference outline nodes. In the pixel shifted leftward by one pixel from the reference outline node pixel, the distance 1 is defined. In the pixel shifted leftward by two pixels from the reference outline node pixel, the distance 2 is defined. In the case of FIG. 10B, such definition is similarly performed up to the distance 4, with respect to the reference outline node pixel in the third row from the top and in the seventh column from the left. When reaching another reference outline node pixel, the distance definition is ended. The distance from each of other reference outline node pixels is defined similarly.

In the example of FIG. 10C, it turns out that the pixel in the first row from the top and in the fourth column from the left is one of the reference outline nodes. In the pixel shifted downward by one pixel from the reference outline node pixel, the distance 1 is defined. In the pixel shifted downward by two pixels from the reference outline node pixel, the distance 2 is defined. In the case of FIG. 10C, such definition is similarly performed up to the distance 4, with respect to the reference outline node pixel in the first row from the top and in the fourth column from the left. When reaching another reference outline node pixel, the distance definition is ended. The distance from each of other reference outline node pixels is defined similarly.

In the example of FIG. 10D, it turns out that the pixel in the sixth row from the top and in the fourth column from the left is one of the reference outline nodes. In the pixel shifted upward by one pixel from the reference outline node pixel, the distance 1 is defined. In the pixel shifted upward by two pixels from the reference outline node pixel, the distance 2 is defined. In the case of FIG. 10D, such definition is similarly performed up to the distance 4, with respect to the reference outline node pixel in the sixth row from the top and in the fourth column from the left. When reaching another reference outline node pixel, the distance definition is ended. The distance from each of other reference outline node pixels is defined similarly.

In the hole center candidate extraction step (S116), the hole center candidate extraction unit 66 (center pixel candidate extraction unit) extracts a candidate for the center pixel of a hole pattern of a reference image by using each distance map generated for each direction.

Figure 11:
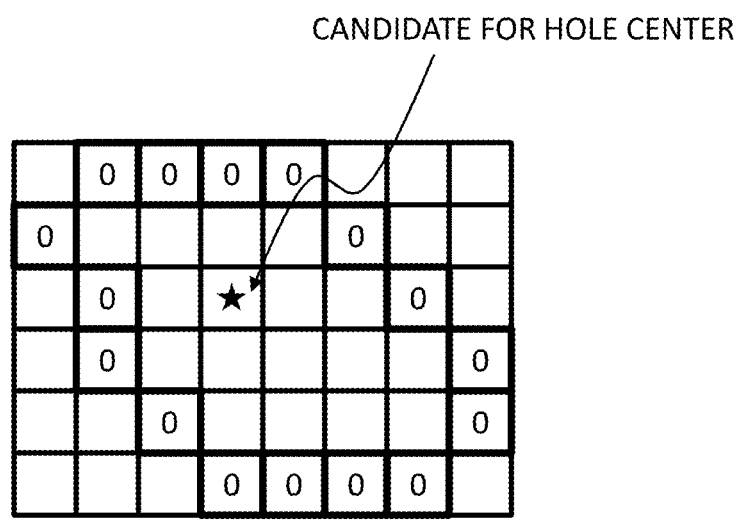
FIG. 11 is a diagram showing an example of a candidate for a center pixel of a hole pattern according to the first embodiment.

FIG. 11 is a diagram showing an example of a candidate for the center pixel of a hole pattern according to the first embodiment. The hole center candidate extraction unit 66 extracts, using, for example, four distance maps in which distances from the top, bottom, right, and left are individually defined, a pixel approximately equidistant from the top and bottom directions and approximately equidistant from the right and left directions. With respect to the approximate equidistance, the difference of the distance should be one or less pixel, and therefore, a pixel with such a distance difference is extracted. Specifically, for example, a pixel is extracted which is with a distance difference of zero or −1 when subtracting the "distance from the right" from "the distance from the left", and with a distance difference of zero or −1 when subtracting "the distance from the bottom" from "the distance from the top". In this case, as shown in the example of FIG. 11, the pixel (asterisk *) in the third row from the top and in the fourth column from the left is a candidate for the center pixel of a hole pattern.

Alternatively, for example, a pixel may be extracted which is with a distance difference of zero or 1 when subtracting the "distance from the right" from "the distance from the left", and with a distance difference of zero or 1 when subtracting "the distance from the bottom" from "the distance from the top". In that case, the pixel in the fourth row from the top and in the fifth column from the left is a candidate for the center pixel of a hole pattern.

Alternatively, for example, a pixel may be extracted which is with a distance difference of zero or 1 when subtracting the "distance from the right" from "the distance from the left", and with a distance difference of zero or −1 when subtracting "the distance from the bottom" from "the distance from the top". In that case, the pixel in the third row from the top and in the fifth column from the left is a candidate for the center pixel of a hole pattern.

Alternatively, for example, a pixel may be extracted which is with a distance difference of zero or −1 when subtracting the "distance from the right" from "the distance from the left", and with a distance difference of zero or 1 when subtracting "the distance from the bottom" from "the distance from the top". In that case, the pixel in the third row from the top and in the fifth column from the left is a candidate for the center pixel of a hole pattern.

As described above, although there is a case where a candidate center hole is shifted by about one pixel depending on a method for definition, it does not matter. It is also acceptable to extract a plurality of candidates for a center pixel under the same extraction definition.

Figure 12:
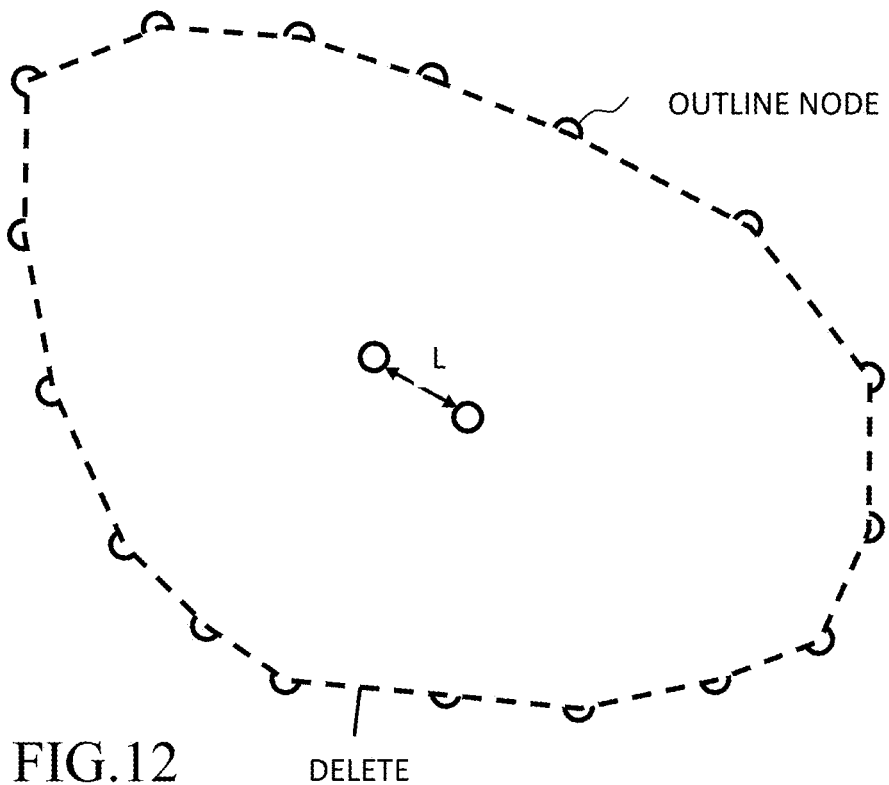
FIG. 12 is an illustration showing an example of a plurality of candidates for a center pixel of a hole pattern according to the first embodiment.

FIG. 12 is an illustration showing an example of a plurality of candidates for a center pixel of a hole pattern according to the first embodiment. FIG. 12 shows the case where two candidates for a center pixel are extracted.

In the hole center check step (S118), when two or more candidates for a center pixel of a hole pattern are extracted, the hole center check unit 68 (removal circuit) removes one of them if the distance L between the candidates for a center pixel is less than or equal to a threshold. In the example of FIG. 12, the right side candidate for the center pixel is removed from the two candidates. Which to remove may be defined in advance, as a positional relation on the removal. When the distance L between two candidates for a center pixel is short, it is not inevitably necessary for the two to exist. The processing of the reference hole edge search/detection step (S120) to be described later can be shortened by removing one of them.

Although a plurality of reference outline nodes serving as candidates for an outline position of a hole pattern of a reference image are known at this stage, it is unknown whether a desired hole pattern can be formed by following the plurality of reference outline nodes. For example, some of them may be located on the outline of another adjacent hole pattern. Then, the outline position on one hole pattern is determined as follows:

In the reference hole edge search/detection step (S120), the reference hole edge search/detection unit 70 (reference outline position search/detection unit) searches and detects, in a plurality of reference outline nodes (second outline position candidate) of a reference image, a group of reference outline nodes (group of second outline position candidates) which satisfies a predetermined condition in the case of using the candidate for the center pixel as a starting point, as a plurality of reference hole edge nodes (reference outline position) where the outline of a hole pattern of a reference image passes.

Figure 13:
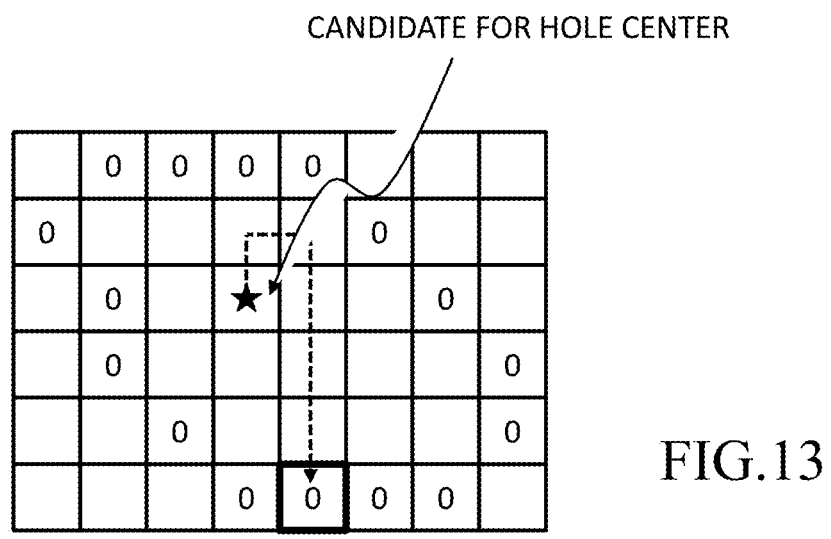
FIG. 13 is a diagram illustrating a method for searching a hole edge node according to the first embodiment.

FIG. 13 is a diagram illustrating a method for searching a hole edge node according to the first embodiment. In FIG. 13, the reference hole edge search/detection unit 70 searches for a group of reference outline nodes, as a plurality of reference hole edge nodes (outline position) along which the outline of a hole pattern passes, where each of pixels individually includes any one of reference outline nodes of the group of reference outline nodes, reached by changing the direction n or less times (n is an integer two or more) starting from a candidate for a center pixel being a starting point. In the case of FIG. 13, starting from a candidate for the center pixel of a hole pattern, the reference hole edge search/detection unit 70 searches and detects, as reference hole edge nodes (outline position) of the hole pattern, a plurality of reference outline nodes, each of which has a distance within a threshold from another reference outline node in all of the reference outline nodes, where each of pixels individually includes any one of the all of the reference outline nodes, reached by changing the direction (e.g., turning back) of the straight line in one of upward, downward, rightward, and leftward directions (±x direction, and ±y direction) n times. Since the value in a distance map of a center pixel candidate or a pixel of changing the direction is equivalent to a relative coordinate from the pixel concerned to a reference outline node, the pixel in the relative coordinate is defined as one of hole edge nodes. Then, all the pixels between the center pixel candidate or the pixel where the direction is changed and the hole edge node are target pixels of next direction change. By repeating this operation, all the hole edge nodes in one hole can be finally extracted. Here, the number of times of changing the direction is n times at the maximum as described above. Since there may be a plurality of paths from a center pixel candidate to each hole edge node, multiple counting of a hole edge node should be avoided. FIG. 13 shows the case, as an example, where the candidate for the center pixel is in the third row from the top and in the fourth column from the left, and it reaches the pixel, including a reference outline node, in the sixth row from the top and in the fifth column from the left by changing the direction twice from upward to rightward, and the, from rightward to downward. It may be possible to reach the pixel concerned by changing the direction once depending on a path. For example, in order to reach the pixel, including a reference outline node, in the first row from the top and in the second column from the left, it is necessary to change the direction at least twice regardless of a selected path. The number of times of changing the direction can be set according to the shape of a formed hole pattern. For example, it is set as n=2. Whether the distance from another reference outline node is within a threshold or not can be determined referring to a distance map. If a reference outline node whose distance from another reference outline node is not within the threshold is detected as a hole edge, since the reference outline node concerned may not form a hole pattern being a closed figure, this center pixel is removed from the candidates for a hole pattern.

By what is described above, a plurality of reference hole edge nodes (outline position) where the outline of a hole pattern passes can be obtained. Recognizing a hole and searching a hole edge can be performed in a high speed by using a distance map as described above. Such plurality of reference hole edge nodes may be output to the storage device 58, as outline positions which form the outline of a hole pattern of a reference image. According to the first embodiment, the following checking is further performed additionally.

In the hole size check step (S122), the hole size check unit 72 determines whether each size of a hole is within a set range.

Figure 14:
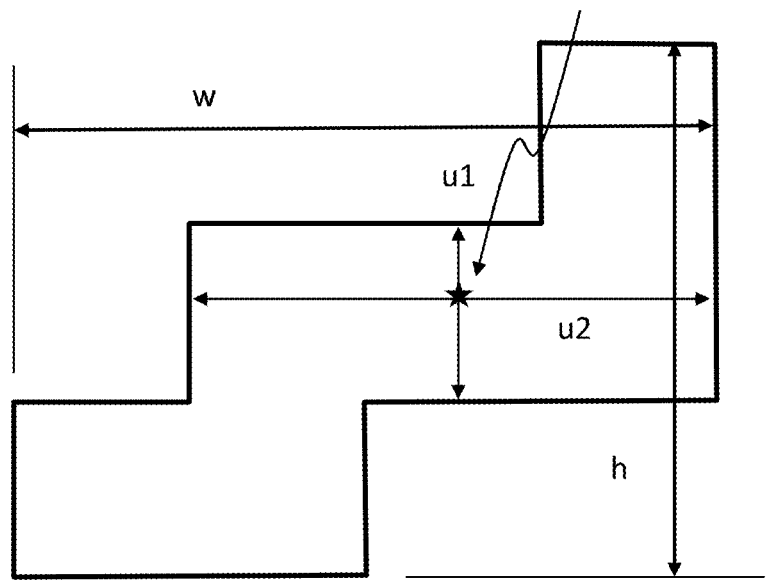
FIG. 14 is a diagram illustrating a method for checking a hole size according to the first embodiment.

FIG. 14 is a diagram illustrating a method for checking a hole size according to the first embodiment. FIG. 14 shows as check items, for example, the size w along the x direction between the outermost peripheral ends, the size h along the y direction between the outermost peripheral ends, the size u1 along the y direction between the peripheral ends and passing through a center pixel candidate of a hole, the size u2 along the x direction between the peripheral ends and passing through a center pixel candidate of a hole, the difference between the size h and the size u1, and/or the difference between the size w and the size u2. If one of them is out of the set range, the pattern obtained based on such a center pixel candidate is removed from candidates because the pattern is not a hole pattern. If a plurality of center pixel candidates are extracted, there is a case where one center pixel candidate is within a set range, and another is out of the set range. In such a case, a plurality of reference hole edge nodes of the hole pattern based on the center pixel candidate within the set range are output and stored in the storage device 58.

In the actual image outline interpolation step (S130), the actual image outline interpolation unit 74 (inspection outline forming unit) forms an inspection outline of a hole pattern of the frame image 31 by interpolating a group of actual image outline nodes (first outline position candidate group)

close to a plurality of reference hole edge nodes of a reference image, in a plurality of actual image outline nodes of the frame image 31.

Figure 15:
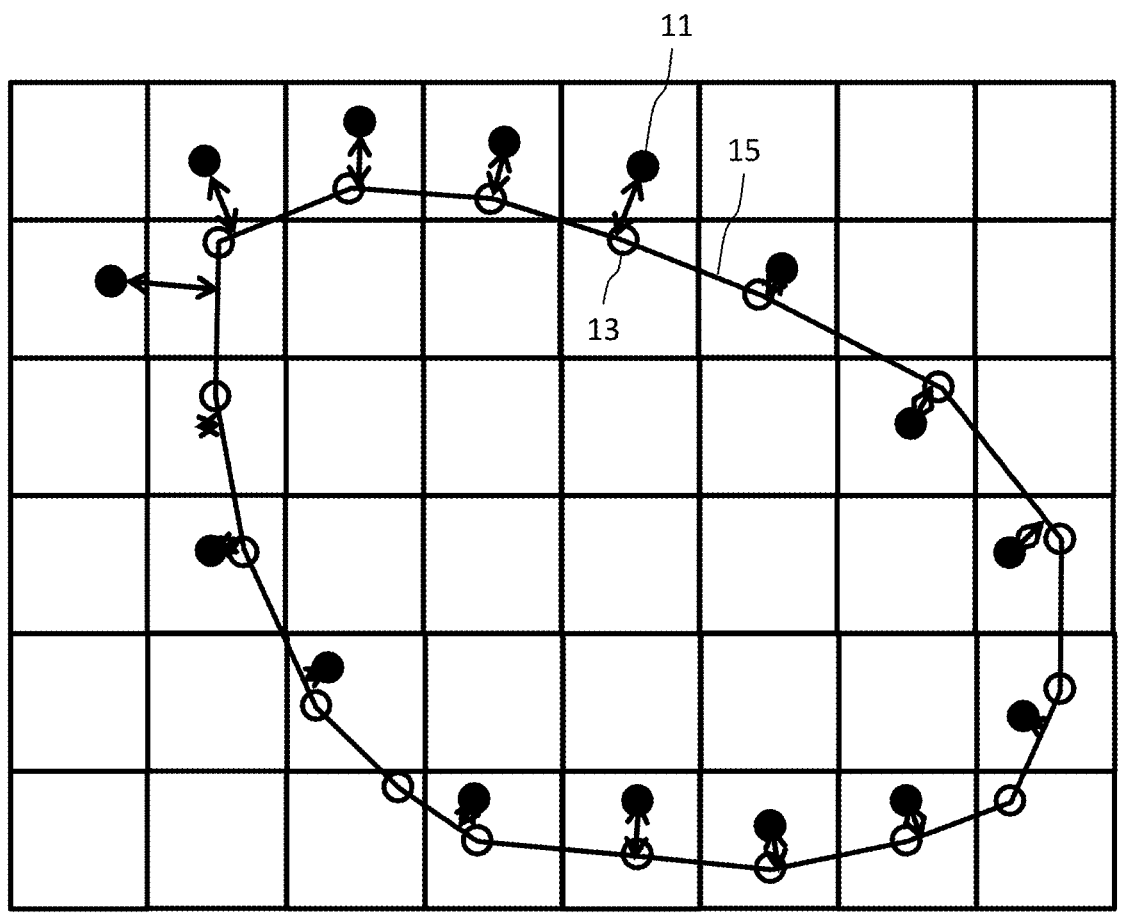
FIG. 15 is a diagram showing an example of an inspection outline and a plurality of reference hole edge nodes according to the first embodiment.

FIG. 15 is a diagram showing an example of an inspection outline and a plurality of reference hole edge nodes according to the first embodiment. The actual image outline interpolation unit 74 selects a group of actual image outline nodes 13 close to a plurality of reference hole edge nodes 11 of a reference image from a plurality of actual image outline nodes of the frame image 31. Then, the actual image outline interpolation unit 74 obtains, by interpolation, positions of an inspection outline 15 which connects the actual image outline nodes 13 in the group. For example, a linear interpolation is used. It is preferable to use Lagrangian interpolation, spline interpolation, or B-spline interpolation. For example, in the Lagrangian interpolation, assuming that three adjacent actual image outline nodes (x position) are x(−1), x(0), and x(1), the outline position at an optional position t in the section [−1, 1] can be defined by the following equation (1). A similar calculation is also performed with respect to the y direction. Although the case of connection between the actual image outline nodes 13 by a straight line is shown in the example of FIG. 15, it is possible to connect three actual image outline nodes by a curved line by using Lagrangian interpolation.

$$x(t)=x(-1)\cdot(t^2/2-t/2)+x(0)\cdot(-t^2+1)+x(1)\cdot(t^2/2+t/2) \quad (1)$$

In the distance calculation step (S132), the distance calculation unit 76 calculates the distance from each of a plurality of reference hole edge nodes to an inspection outline. When calculating the distance, it is determined whether the outline of an actual image is located outside a hole surrounded by reference hole edge nodes or located inside it. When located inside, the distance is calculated as a negative value. When located outside, the distance is calculated as a positive value.

Figure 16:
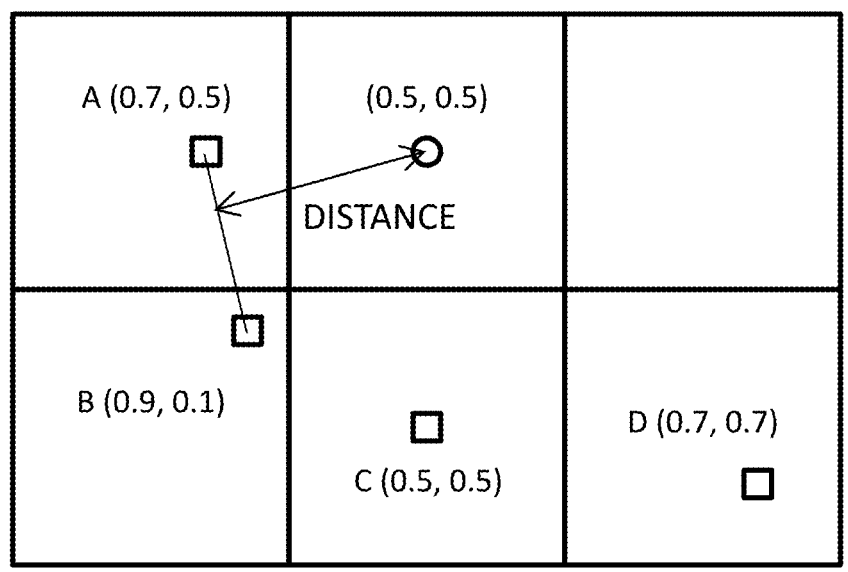
FIG. 16 is a diagram illustrating an example of a method for calculating a distance according to the first embodiment.

FIG. 16 is a diagram illustrating an example of a method for calculating a distance according to the first embodiment. In the example of FIG. 16, coordinates of the actual image outline node 13 and those of each reference hole edge node 11 indicate a relative position from the reference point (e.g., upper left corner) of a pixel in which each node concerned is located. Here, the pixel size is defined as 1. Two actual image outline nodes close in distance to each other are selected from reference hole edge nodes. In the case of FIG. 16, since the distances (0.80, 0.85) to A and B are shorter than the distances (1.00, 1.70) to other nodes, the straight line connecting these two points A and B is defined as the outline of a measurement target. Drawing a perpendicular line from the reference edge hole node to this outline, the length of the perpendicular line is defined as the distance between the reference edge hole and the outline. This distance is obtained by geometric calculation. In the case of FIG. 16, the distance is about 0.76.

FIGS. 17A to 17C are diagrams showing examples of a distance from a reference hole edge node to an inspection outline according to the first embodiment. FIG. 17A is the same as FIG. 13. If the vector direction when calculating the distance from a reference hole edge node to an inspection outline is 90 degrees or less with respect to the last searching/detecting direction (search direction) in searching for the reference hole edge node shown in FIG. 17A, the distance is positive as shown in FIG. 17B. If the vector direction when calculating the distance from a reference hole edge node to an inspection outline is not 90 degrees or less with respect to the last searching/detecting direction (search direction) in searching for the reference hole edge node shown in FIG. 17A, the distance is negative as shown in FIG. 17B. An example of the distance from each reference hole edge node to an inspection outline is shown in FIG. 17C.

The distance calculation unit 76 calculates the total of distances from each reference hole edge node to an inspection outline, or the average of them. The case 1 in FIG. 17C shows that the total of distances is, for example, −8.6. The case 2 shows that, as the average of distances, the value obtained by dividing the total of distances by N being the number of the reference hole edge nodes is, for example, −8.6/16. The case 3 shows that, as the average of distances, the value obtained by dividing the total of distances by AREA being the area (the number of pixels) of the hole pattern of a reference image is, for example, −8.6/33.

In the comparison step (S134), the comparison processing unit 78 (comparison unit) compares a value based on the distance and an inspection threshold. The value (response value) based on the distance indicates the total of distances from each reference hole edge node to an inspection outline, or the average of them as described above. A hole pattern whose response value is larger than an inspection threshold is determined to be defective. A comparison result is output to the storage device 109, the monitor 117, or the memory 118.

Thus, a CD error can be calculated at a high speed by performing partial integration such as a total of distances or an average of them instead of calculating the total area of a hole. Further, when calculating the distance from each reference hole edge node to an inspection outline, errors due to discreteness of an outline node can be reduced by obtaining the outline of a hole pattern of an actual image by interpolation processing.

Figures 18A, 18B:
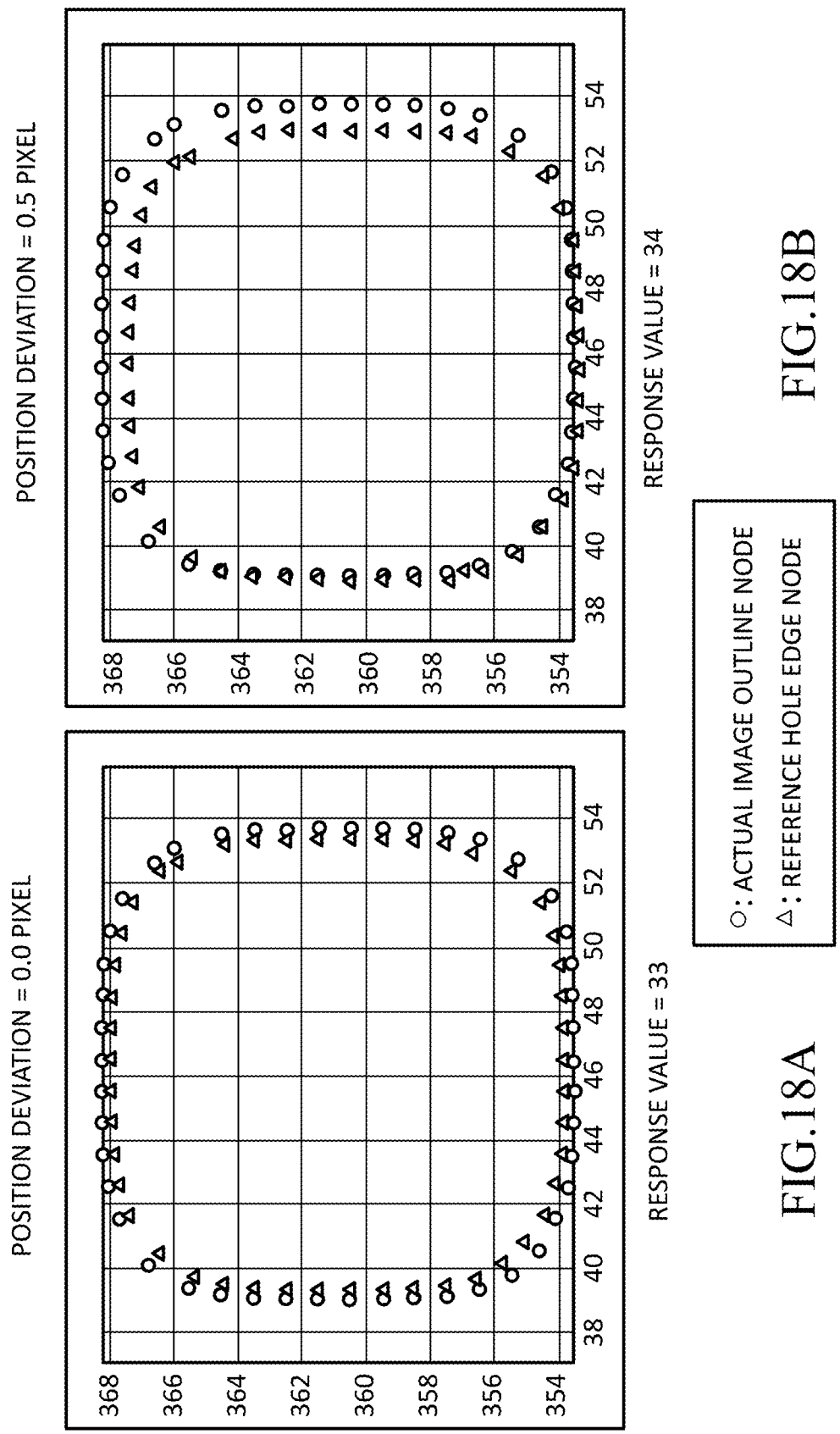
FIGS. 18A and 18B are diagrams showing examples of an inspection result according to the first embodiment.

FIGS. 18A and 18B are diagrams showing examples of an inspection result according to the first embodiment. FIG. 18A shows a result of comparing, in a state where an alignment deviation amount has been adjusted to be 0.0 pixel, a hole pattern of a reference image and a hole pattern of an actual image. FIG. 18B shows a result of comparing, in a state where an alignment deviation amount has been purposely adjusted to be 0.5 pixel, a hole pattern of a reference image and a hole pattern of an actual image. In both the cases, the comparison difference between the hole pattern of the reference image and the hole pattern of the actual image can be a small amount. This result indicates that the hole pattern has been extracted highly accurately.

As described above, according to the first embodiment, it is possible to perform a hole detection with high accuracy while aiming at reducing the processing time. For example, each reference hole edge node can be searched/detected with high accuracy and/or high speed from a reference image. Thus, it is possible to search/detect a hole pattern from a reference image, with high accuracy and/or high speed. Further, since a reference hole edge node can be searched/detected highly accurately, it is possible, by using the result, to extract a group of actual image outline nodes 13, which actually forms an outline, with high accuracy and/or high speed from a plurality of actual image outline nodes of a hole pattern of a frame image.

In the above description, each " . . . circuit" includes processing circuitry. As the processing circuitry, for example, an electric circuit, computer, processor, circuit board, quantum circuit, semiconductor device, or the like can be used. Common processing circuitry (the same processing circuitry), or different processing circuitry (separate processing circuitry) may be used for each " . . . circuit". A program for causing a computer to execute processing or the like may be stored in a recording medium, such as a magnetic disk drive, flash memory, etc. For example, the position circuit 107, the comparison circuit 108, the reference image generation circuit 112, the stage control circuit 114, the lens control circuit 124, the blanking control circuit 126, and the deflection control circuit 128 may be configured by at least one processing circuit described above.

Embodiments have been explained referring to specific examples described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by applying a primary electron beam from each of a plurality of irradiation sources.

Further, according to the embodiments, search and detection is not limited to a hole pattern from a reference image, a hole pattern can be highly accurately searched and detected from an image. Therefore, if the configuration of searching and detecting a hole pattern from a reference image which is generated based on design data is applied to a frame image being an actual image, it becomes possible to highly accurately search and detect a hole pattern even from a frame image. Further, with respect also to a frame image (actual image), a hole pattern in an image can be similarly extracted not only from an electron beam image but from an optical image acquired due to irradiation with lights, such as ultraviolet rays, for example.

While the apparatus configuration, control method, and the like not directly necessary for explaining the present invention are not described, some or all of them can be appropriately selected and used on a case-by-case basis when needed.

Further, any image hole pattern search/detection method, pattern inspection method, pattern inspection apparatus, and image hole pattern search/detection apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for searching a hole pattern in an image comprising:
   extracting, from an image where a hole pattern is formed, a plurality of outline position candidates serving as candidates for a plurality of positions where an outline of the hole pattern passes;
   generating, with respect to each pixel in a region including the plurality of outline position candidates, for each direction of a plurality of directions, a distance map which defines a distance from each of the plurality of outline position candidates to each of pixels arrayed in a target direction of the plurality of directions;
   extracting a candidate for a center pixel of the hole pattern by using the distance map generated for the each direction; and
   searching, in the plurality of outline position candidates, a group of outline position candidates which satisfies a predetermined condition in a case of using the candidate for the center pixel as a starting point, as a plurality of outline positions where the outline of the hole pattern passes.

2. The method according to claim 1, wherein, in a case where at least two candidates for the center pixel of the hole pattern are extracted, one of the at least two candidates is removed from candidates for the center pixel if a distance between the at least two candidates for the center pixel is not greater than a threshold.

3. The method according to claim 1, wherein the group of outline position candidates, where each of the pixels individually includes any one of outline position candidates of the group of outline position candidates, reached by changing a direction at most n times (n is an integer of at least two) starting from the candidate for the center pixel being the starting point is searched as the plurality of outline positions where the outline of the hole pattern passes.

4. A pattern inspection method comprising:
   acquiring an inspection image of a substrate on which a first hole pattern has been formed, the inspection image being an image to be inspected;
   extracting, from the inspection image, a plurality of first outline position candidates serving as candidates for a plurality of positions where an outline of the first hole pattern passes;
   extracting, from a reference image to be compared with the inspection image, a plurality of second outline position candidates serving as candidates for a plurality of positions where an outline of a second hole pattern corresponding to the first hole pattern passes;
   generating, with respect to each pixel in a region including the plurality of second outline position candidates, for each direction of a plurality of directions, a distance map which defines a distance from each of the plurality of second outline position candidates to each of pixels arrayed in a target direction;
   extracting, using the distance map generated for the each direction, a candidate for a center pixel of the second hole pattern;
   searching, in the plurality of second outline position candidates, a group of second outline position candidates which satisfies a predetermined condition in a case of using the candidate for the center pixel as a starting point, as a plurality of reference outline positions where the outline of the second hole pattern passes;
   forming an inspection outline of the first hole pattern by interpolating a group of first outline position candidates close to the plurality of reference outline positions in the plurality of first outline position candidates;
   calculating a distance from each of the plurality of reference outline positions to the inspection outline; and
   comparing a value based on the distance and an inspection threshold, and outputting a result.

5. The method according to claim 4, wherein the inspection outline is formed by performing a Lagrangian interpolation.

6. The method according to claim 4, wherein, in a case where at least two candidates for the center pixel of the second hole pattern are extracted, one of the at least two candidates is removed from candidates for the center pixel if a distance between the at least two candidates for the center pixel is not greater than a threshold.

7. The method according to claim 4, wherein the group of second outline position candidates, where each of the pixels individually includes any one of second outline position candidates of the group of second outline position candidates, reached by changing a direction at most n times (n is an integer of at least two) starting from the candidate for the center pixel being the starting point is searched as the plurality of reference outline positions where the outline of the second hole pattern passes.

8. A pattern inspection apparatus comprising:
an image acquisition mechanism configured to acquire an inspection image of a substrate on which a first hole pattern has been formed, the inspection image being an image to be inspected;
a first outline position candidate extraction circuit configured to extract, from the inspection image, a plurality of first outline position candidates serving as candidates for a plurality of positions where an outline of the first hole pattern passes;
a second outline position candidate extraction circuit configured to extract, from a reference image to be compared with the inspection image, a plurality of second outline position candidates serving as candidates for a plurality of positions where an outline of a second hole pattern corresponding to the first hole pattern passes;
a distance map generation circuit configured to generate, with respect to each pixel in a region including the plurality of second outline position candidates, for each direction of a plurality of directions, a distance map which defines a distance from each of the plurality of second outline position candidates to each of pixels arrayed in a target direction;
a center pixel candidate extraction circuit configured to extract, using the distance map generated for the each direction, a candidate for a center pixel of the second hole pattern;
a search circuit configured to search, in the plurality of second outline position candidates, a group of second outline position candidates which satisfies a predetermined condition in a case of using the candidate for the center pixel as a starting point, as a plurality of reference outline positions where the outline of the second hole pattern passes;
an inspection outline forming circuit configured to form an inspection outline of the first hole pattern by interpolating a group of first outline position candidates close to the plurality of reference outline positions in the plurality of first outline position candidates;
a distance calculation circuit configured to calculate a distance from each of the plurality of reference outline positions to the inspection outline; and
a comparison circuit configured to compare a value based on the distance and an inspection threshold.

9. The apparatus according to claim 8, wherein the inspection outline is formed by performing a Lagrangian interpolation.

10. The apparatus according to claim 8, wherein a removal circuit is further included which removes, in a case where at least two candidates for the center pixel of the second hole pattern are extracted, one of the at least two candidates from candidates for the center pixel in case that a distance between the at least two candidates for the center pixel is not greater than a threshold.

11. The apparatus according to claim 8, wherein the search circuit searches the group of second outline position candidates, where each of the pixels individually includes any one of second outline position candidates of the group of second outline position candidates, reached by changing a direction at most n times (n is an integer of at least two) starting from the candidate for the center pixel being a starting point, as the plurality of reference outline positions where the outline of the second hole pattern passes.

12. An apparatus for searching a hole pattern in an image comprising:
an outline position candidate extraction circuit configured to extract, from an image where a hole pattern is formed, a plurality of outline position candidates serving as candidates for a plurality of positions where an outline of the hole pattern passes;
a distance map generation circuit configured to generate, with respect to each pixel in a region including the plurality of outline position candidates, for each direction of a plurality of directions, a distance map which defines a distance from each of the plurality of outline position candidates to each of pixels arrayed in a target direction of the plurality of directions;
a center pixel candidate extraction circuit configured to extract, using the distance map generated for the each direction, a candidate for a center pixel of the hole pattern; and
a search circuit configured to search, in the plurality of outline position candidates, a group of outline position candidates which satisfies a predetermined condition in a case of using the candidate for the center pixel as a starting point, as a plurality of outline positions where the outline of the hole pattern passes.

13. The apparatus according to claim 12, wherein a removal circuit is further included which removes, in a case where at least two candidates for the center pixel of the hole pattern are extracted, one of the at least two candidates from candidates for the center pixel in case that a distance between the at least two candidates for the center pixel is not greater than a threshold.

14. The apparatus according to claim 12, wherein the search circuit searches the group of outline position candidates, where each of the pixels individually includes any one of outline position candidates of the group of outline position candidates, reached by changing a direction at most n times (n is an integer of at least two) starting from the candidate for the center pixel being a starting point, as the plurality of outline positions where the outline of the hole pattern passes.

* * * * *